(12) United States Patent
Lebby et al.

(10) Patent No.: US 11,262,605 B2
(45) Date of Patent: *Mar. 1, 2022

(54) ACTIVE REGION-LESS POLYMER MODULATOR INTEGRATED ON A COMMON PIC PLATFORM AND METHOD

(71) Applicant: Lightwave Logic Inc., Englewood, CO (US)

(72) Inventors: Michael Lebby, San Francisco, CA (US); Yasufumi Enami, Tucson, AZ (US)

(73) Assignee: Lightwave Logic Inc., Englewood, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 16/710,066

(22) Filed: Dec. 11, 2019

(65) Prior Publication Data

US 2020/0183201 A1    Jun. 11, 2020

Related U.S. Application Data

(63) Continuation-in-part of application No. 15/692,080, filed on Aug. 31, 2017, now Pat. No. 10,527,786.

(51) Int. Cl.
*G02F 1/065* (2006.01)
*G02F 1/225* (2006.01)
(Continued)

(52) U.S. Cl.
CPC .......... *G02F 1/065* (2013.01); *G02B 6/12002* (2013.01); *G02F 1/225* (2013.01);
(Continued)

(58) Field of Classification Search
CPC ................ H01S 5/0265; H01S 5/1032; H01S 5/026–2068; G02F 1/065; G02B 6/12004–12033; G02B 2006/12121
See application file for complete search history.

(56) References Cited

U.S. PATENT DOCUMENTS 4,286,232 A * 8/1981 Puech ................... H01S 5/42
372/50.11
4,747,649 A * 5/1988 Heinen ............ G02B 6/12004
257/E31.055
(Continued)

FOREIGN PATENT DOCUMENTS

EP    2866067 A1 *  4/2015  ......... G02B 6/29323
EP    2913902 A1 *  9/2015  ............ G02B 6/34
(Continued)

*Primary Examiner* — Joshua King
(74) *Attorney, Agent, or Firm* — Parsons & Goltry; Robert Parsons; Michael Goltry

(57) ABSTRACT

A monolithic PIC including a monolithic laser formed in/on a platform and a polymer modulator monolithically built onto the platform and optically coupled to the laser. The modulator includes a first cladding layer, a passive core region with a surface abutting a surface of the first cladding layer, the core region extending to define an input and an output for the modulator. A shaped electro-optic polymer active component has a surface abutting a surface of a central portion of the core region. The active component is polled to align dipoles and promote modulation of light and has a length that extends only within a modulation area defined by modulation electrodes. A second cladding layer encloses the active component and is designed to produce adiabatic transition of light waves traveling in the core region into the active component to travel the length thereof and return to the core region.

20 Claims, 20 Drawing Sheets

(51) Int. Cl.
- *H01S 5/026* (2006.01)
- *G02B 6/12* (2006.01)
- *G02F 1/21* (2006.01)
- *G02B 6/138* (2006.01)
- *H01S 5/10* (2021.01)
- *H01S 5/40* (2006.01)
- *G02B 6/122* (2006.01)

(52) U.S. Cl.
CPC .......... *H01S 5/0265* (2013.01); *G02B 6/1228* (2013.01); *G02B 6/138* (2013.01); *G02B 2006/12069* (2013.01); *G02B 2006/12121* (2013.01); *G02B 2006/12142* (2013.01); *G02F 1/212* (2021.01); *H01S 5/1014* (2013.01); *H01S 5/4031* (2013.01)

(56) References Cited

U.S. PATENT DOCUMENTS

| | | | |
|---|---|---|---|
| 4,772,787 A * | 9/1988 | Trommer | G02B 6/12002 250/227.29 |
| 4,966,430 A * | 10/1990 | Weidel | G02B 6/2817 257/84 |
| 5,003,550 A * | 3/1991 | Welch | H01S 5/42 372/102 |
| 5,051,790 A * | 9/1991 | Hammer | H01L 31/12 257/80 |
| 5,125,054 A * | 6/1992 | Ackley | G02B 6/30 385/130 |
| 5,193,131 A * | 3/1993 | Bruno | G02B 6/42 257/189 |
| 5,195,150 A * | 3/1993 | Stegmueller | G02B 6/1245 385/33 |
| 5,218,584 A * | 6/1993 | Gfeller | G11B 7/0908 369/112.27 |
| 5,321,718 A * | 6/1994 | Waarts | G02F 1/37 359/326 |
| 5,331,659 A * | 7/1994 | Ohata | G11C 11/42 257/E31.102 |
| 5,369,529 A * | 11/1994 | Kuo | G02B 6/4214 250/551 |
| 5,396,363 A * | 3/1995 | Valette | G02B 6/122 359/248 |
| 5,416,870 A * | 5/1995 | Chun | G02B 6/1221 29/825 |
| 5,419,804 A * | 5/1995 | Ojha | H01L 21/30621 252/79.1 |
| 5,465,310 A * | 11/1995 | Kersten | G02B 6/12004 385/22 |
| 5,513,196 A * | 4/1996 | Bischel | H01S 5/141 372/102 |
| 5,545,359 A * | 8/1996 | Ackley | G02B 6/4214 264/1.24 |
| 5,673,284 A * | 9/1997 | Congdon | G02B 6/12004 372/102 |
| 5,825,047 A * | 10/1998 | Ajisawa | H01L 31/105 257/12 |
| 5,835,646 A * | 11/1998 | Yoshimura | G02B 6/262 385/14 |
| 5,937,129 A * | 8/1999 | Jeong | G02F 1/365 385/129 |
| 6,011,641 A * | 1/2000 | Shin | G02F 1/065 359/251 |
| 6,031,945 A * | 2/2000 | You | G02B 6/1221 385/14 |
| 6,067,387 A * | 5/2000 | Oh | G02F 1/065 385/2 |
| 6,210,867 B1 * | 4/2001 | You | G02F 1/365 430/321 |
| 6,236,773 B1 * | 5/2001 | Butler | G02B 6/12004 385/14 |
| 6,282,219 B1 * | 8/2001 | Butler | G02B 6/12004 372/102 |
| 6,311,004 B1 * | 10/2001 | Kenney | G02F 1/065 385/130 |
| 6,341,189 B1 * | 1/2002 | Deacon | G02B 6/1228 385/130 |
| 6,487,328 B2 * | 11/2002 | Butler | G02B 6/12004 385/14 |
| 6,542,525 B1 * | 4/2003 | Matsumoto | H01S 5/0265 372/26 |
| 6,558,585 B1 * | 5/2003 | Zhang | G02F 1/065 205/122 |
| 6,739,761 B2 * | 5/2004 | Tsukamoto | G02B 6/10 385/89 |
| 6,778,572 B1 * | 8/2004 | Ohsaka | H01L 24/05 372/43.01 |
| 6,793,405 B1 * | 9/2004 | Murata | G02B 6/42 385/88 |
| 6,804,423 B2 * | 10/2004 | Tsukamoto | G02B 6/138 385/14 |
| 6,934,313 B1 * | 8/2005 | Deacon | H01S 5/4062 372/64 |
| 7,194,016 B2 * | 3/2007 | Bullington | G02B 6/4214 372/108 |
| 7,212,713 B2 * | 5/2007 | Fukuzawa | G02B 6/125 385/129 |
| 7,327,771 B2 * | 2/2008 | Kim | G02B 6/12004 372/50.1 |
| 7,343,054 B1 * | 3/2008 | Lee | G02B 6/136 385/11 |
| 7,379,633 B1 * | 5/2008 | Ashley | G01C 19/722 385/14 |
| 7,394,841 B1 * | 7/2008 | Konttinen | G03B 21/2013 372/45.013 |
| 7,480,427 B2 * | 1/2009 | Kufner | G02B 6/3604 385/15 |
| 7,536,066 B2 * | 5/2009 | Kato | G02B 6/12004 385/14 |
| 7,565,084 B1 * | 7/2009 | Wach | H04B 10/564 398/201 |
| 7,650,052 B2 * | 1/2010 | Krishnamoorthy | G02B 6/305 385/14 |
| 7,656,922 B2 * | 2/2010 | Behfar | H01S 5/0265 372/50.1 |
| 7,703,993 B1 * | 4/2010 | Darbinyan | G02B 6/4232 385/92 |
| 7,944,958 B2 * | 5/2011 | Konttinen | H01S 5/026 372/45.013 |
| 8,056,220 B2 * | 11/2011 | Kim | H05K 1/0274 29/829 |
| 8,165,437 B2 * | 4/2012 | Pyo | G02B 6/34 385/37 |
| 8,388,239 B2 * | 3/2013 | Hodono | G02B 6/423 385/88 |
| 8,417,078 B2 * | 4/2013 | Riester | G02B 6/4214 385/47 |
| 8,588,559 B2 * | 11/2013 | Wu | G02B 6/4292 385/14 |
| 8,660,391 B1 * | 2/2014 | Fish | G02B 6/124 385/37 |
| 8,915,657 B2 * | 12/2014 | Inoue | G02B 6/42 385/91 |
| 9,057,844 B2 * | 6/2015 | Doany | G02B 6/305 |
| 9,285,554 B2 * | 3/2016 | Doany | G02B 6/12002 |
| 9,341,786 B1 * | 5/2016 | Gamache | G02B 6/4246 |
| 10,527,786 B2 * | 1/2020 | Leonberger | H01S 5/0265 |
| 10,591,755 B2 * | 3/2020 | Becker | G02F 1/225 |
| 2001/0041025 A1 * | 11/2001 | Farahi | G02B 6/42 385/14 |
| 2002/0018507 A1 * | 2/2002 | Deacon | H01S 5/141 372/96 |
| 2003/0020997 A1 * | 1/2003 | Ash | H01S 5/0265 359/238 |
| 2003/0086448 A1 * | 5/2003 | Deacon | H01S 5/02325 372/20 |
| 2003/0095737 A1 * | 5/2003 | Welch | G01R 31/31728 385/14 |

(56) References Cited

U.S. PATENT DOCUMENTS

| | | | |
|---|---|---|---|
| 2003/0123806 A1* | 7/2003 | Erben | G02B 6/26 385/50 |
| 2003/0156794 A1* | 8/2003 | Oh | G02B 6/1221 385/43 |
| 2004/0105480 A1* | 6/2004 | Sidorin | H01S 5/141 372/97 |
| 2004/0165637 A1* | 8/2004 | Bullington | G02B 6/4214 372/50.11 |
| 2004/0170351 A1* | 9/2004 | Fishman | H01S 5/10 385/3 |
| 2004/0234210 A1* | 11/2004 | Nagasaka | G02B 6/4214 385/88 |
| 2005/0083982 A1* | 4/2005 | Behfar | H01S 5/026 372/50.1 |
| 2005/0224946 A1* | 10/2005 | Dutta | G02B 6/4224 257/686 |
| 2005/0254743 A1* | 11/2005 | Akiyama | H04B 10/505 385/3 |
| 2006/0118893 A1* | 6/2006 | Behfar | H01S 5/18 257/414 |
| 2006/0210232 A1* | 9/2006 | Wu | G02F 1/225 385/140 |
| 2006/0227833 A1* | 10/2006 | O'Daniel | H01S 5/1082 372/50.1 |
| 2006/0239605 A1* | 10/2006 | Palen | G02B 6/4206 385/14 |
| 2007/0172186 A1* | 7/2007 | Tsunoda | H01S 5/14 385/129 |
| 2007/0263973 A1* | 11/2007 | Van Laere | G02B 6/124 385/129 |
| 2008/0273567 A1* | 11/2008 | Yariv | H01S 5/1032 372/50.1 |
| 2009/0232443 A1* | 9/2009 | Oda | G02B 6/4249 385/14 |
| 2009/0290837 A1* | 11/2009 | Chen | G02B 6/34 385/37 |
| 2010/0014800 A1* | 1/2010 | Derose | G02F 1/065 385/2 |
| 2010/0092128 A1* | 4/2010 | Okayama | G02B 6/4246 385/14 |
| 2011/0052114 A1* | 3/2011 | Bernasconi | H01S 5/50 385/3 |
| 2011/0142395 A1* | 6/2011 | Fortusini | G02B 6/124 385/37 |
| 2011/0222570 A1* | 9/2011 | Junesand | H01S 5/021 372/50.1 |
| 2012/0057610 A1* | 3/2012 | Dallesasse | H01S 5/141 372/20 |
| 2012/0072931 A1* | 3/2012 | Imada | G11B 5/6005 720/672 |
| 2012/0327754 A1* | 12/2012 | Olson | H01S 5/141 369/47.15 |
| 2013/0016744 A1* | 1/2013 | Li | H01S 5/1039 372/20 |
| 2013/0301985 A1* | 11/2013 | Achouche | G02B 6/12004 385/30 |
| 2014/0133817 A1* | 5/2014 | Lealman | G02B 6/29316 385/129 |
| 2014/0153605 A1* | 6/2014 | Arimoto | H01S 5/18 372/50.11 |
| 2014/0161148 A1* | 6/2014 | Osinki | H01S 5/4006 372/50.1 |
| 2014/0205234 A1* | 7/2014 | Rong | G02B 6/1223 385/28 |
| 2014/0270618 A1* | 9/2014 | Dinu | H01S 5/14 385/3 |
| 2014/0334768 A1* | 11/2014 | Chang | G02B 6/4212 385/14 |
| 2015/0117491 A1* | 4/2015 | Lee | H01S 5/02446 374/141 |
| 2015/0236473 A1* | 8/2015 | Lee | G02F 1/0102 359/245 |
| 2016/0025926 A1* | 1/2016 | Taylor | H01P 3/026 385/14 |
| 2016/0248225 A1* | 8/2016 | Sayyah | H01S 5/06821 |
| 2016/0294155 A1* | 10/2016 | Zheng | G02B 6/12004 |
| 2016/0306256 A1* | 10/2016 | Sun | G02B 6/138 |
| 2016/0380405 A1* | 12/2016 | Takiguchi | H01S 5/34313 372/26 |
| 2017/0179680 A1* | 6/2017 | Mahgerefteh | H01S 5/0064 |
| 2017/0256915 A1* | 9/2017 | Ghosh | H01S 5/0421 |
| 2018/0081118 A1* | 3/2018 | Klamkin | G02B 6/4208 |
| 2018/0106964 A1* | 4/2018 | Luo | H01S 5/1035 |

FOREIGN PATENT DOCUMENTS

| | | | | |
|---|---|---|---|---|
| JP | 63096982 A | * | 4/1988 | H01S 5/187 |
| JP | 2004149711 A | * | 5/2004 | C08G 73/1085 |
| JP | 2004523113 A | * | 7/2004 | H01S 5/0265 |
| JP | 2010147359 A | * | 7/2010 | G02B 6/4206 |
| WO | WO-2007044543 A2 | * | 4/2007 | G02B 6/136 |
| WO | WO-2016011002 A1 | * | 1/2016 | G02B 6/12004 |

* cited by examiner

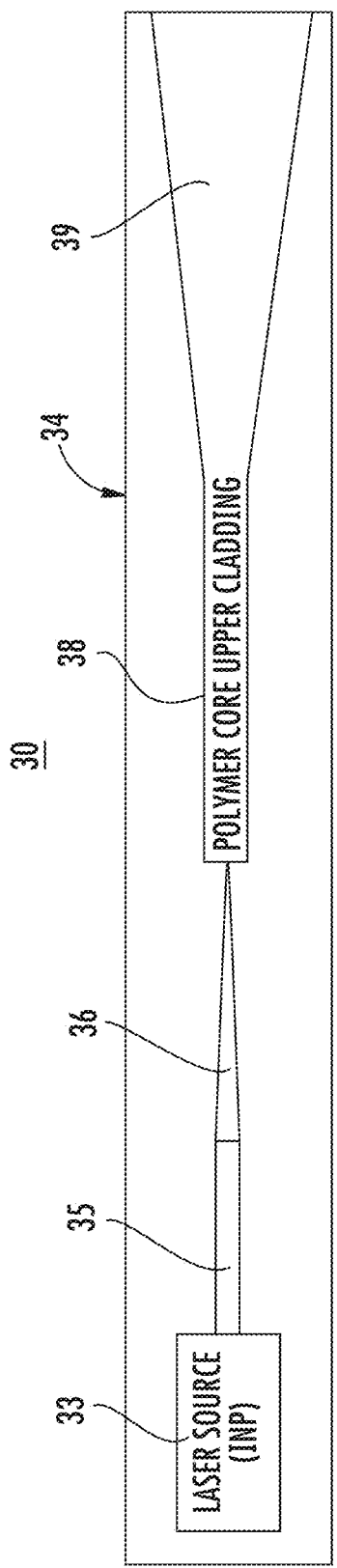
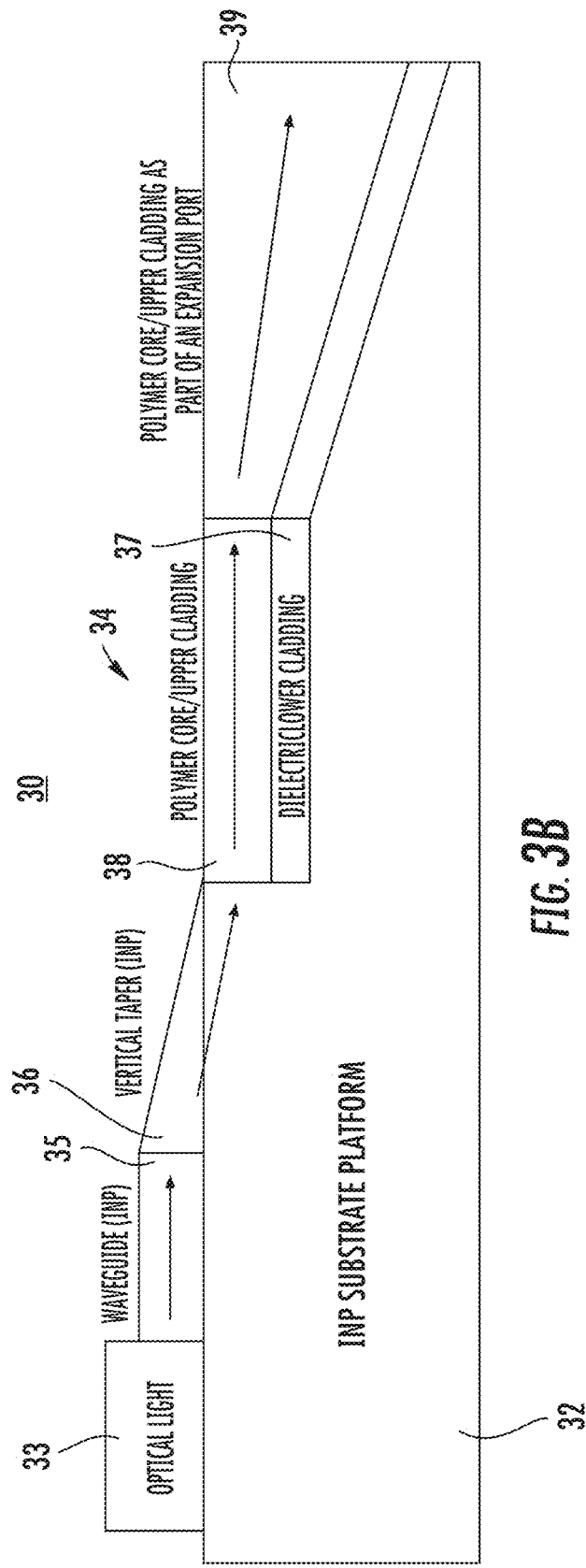
FIG. 3A
FIG. 3B

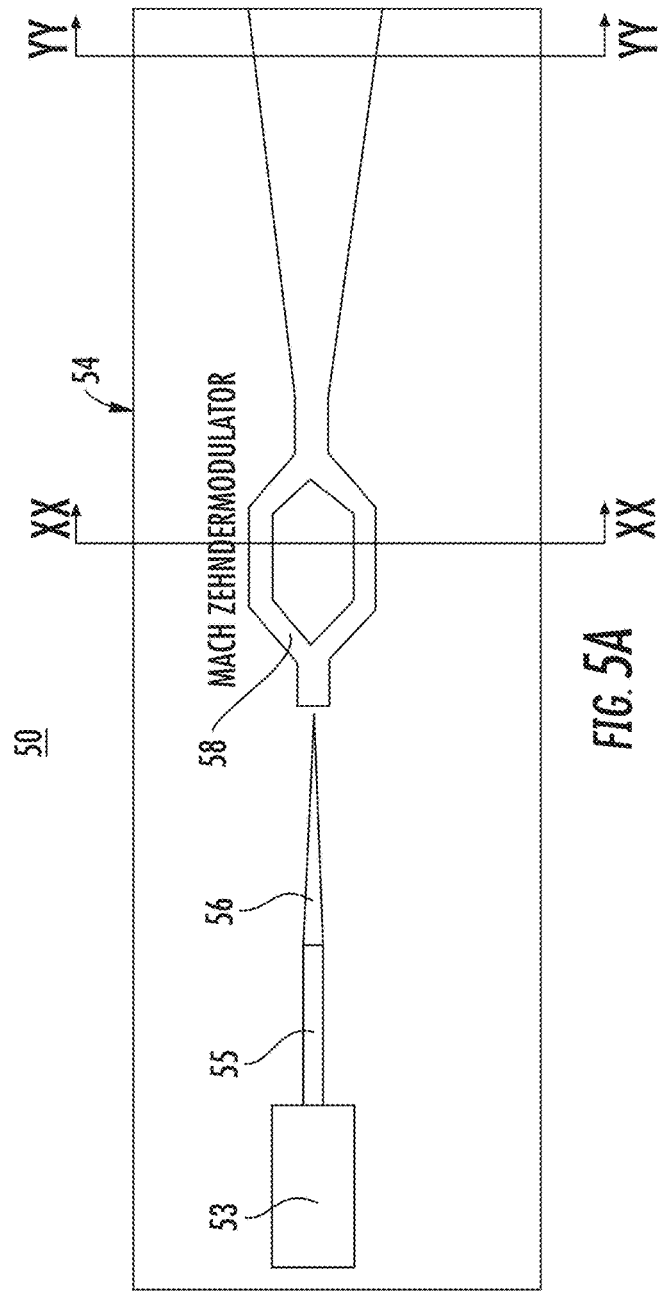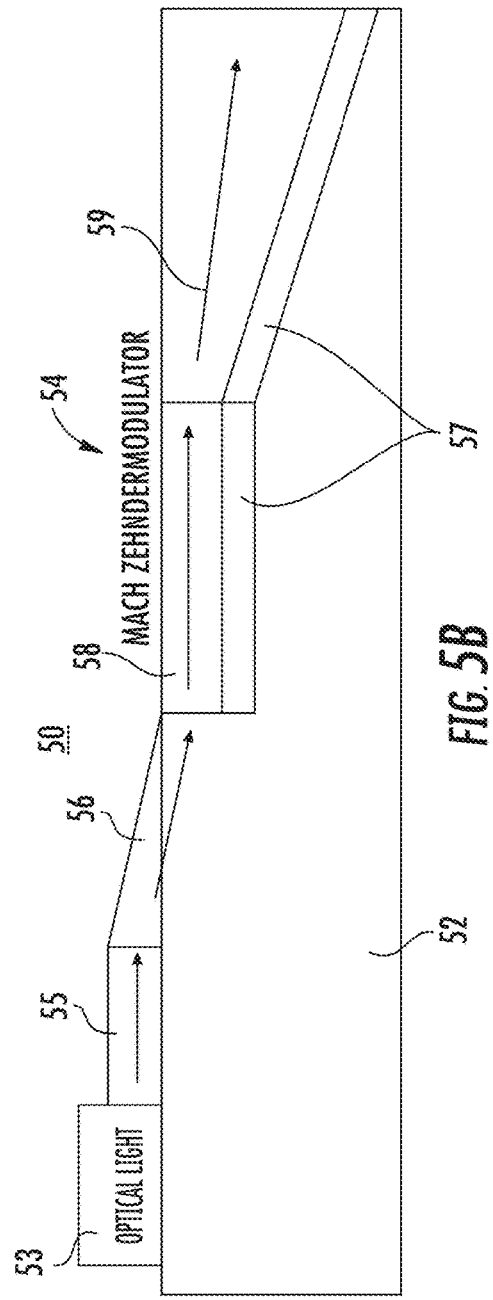
FIG. 5A
FIG. 5B

SINGLE - LAYER
TEMPERATURE = TG

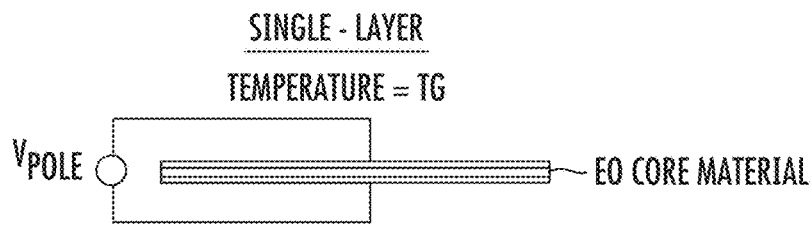

FIG. 7A

- STRAIGHTFORWARD POLING
  - NO VOLTAGE DIVISION
  - $V_{CORE} = V_{POLE}$

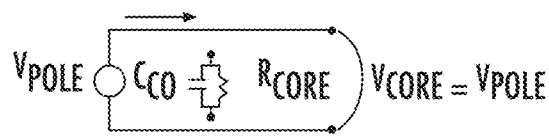

FIG. 7B

3 - LAYER MODULATOR STACK
TEMPERATURE = TG

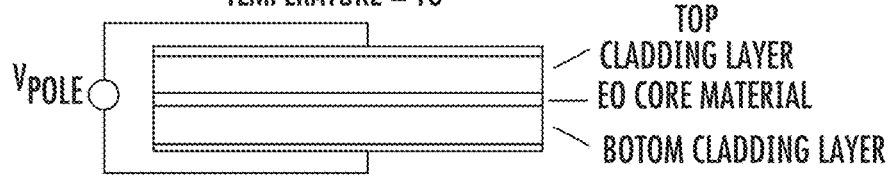

FIG. 8A

- PROBLEMATIC POLING
  - VOLTAGE DIVISION
  - $V_{CORE} \ll V_{POLE}$

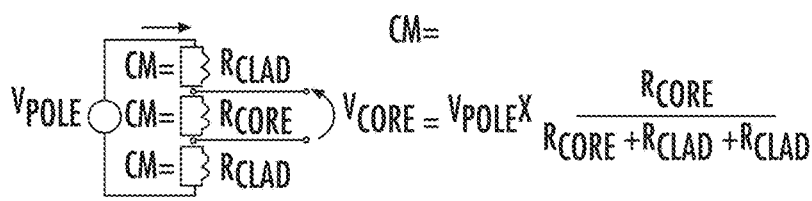

$\sigma$ = CONDUCTIVITY

RESISTANCE = $\frac{LENGTH}{\sigma \times AREA}$

FOR $V_{CORE} = V_{POLE}$
$\sigma_{CLAD} \gg \sigma_{CORE}$

WHEN $V_{CORE} = V_{POLE}$ R33 IS MAXIMIZED_AND RESULTING DRIVE VOLTAGE IS MINIMIZED

FIG. 8B

| MATERIAL | RESISTIVITY AT TG |
|---|---|
| LWL CORE MATERIAL | $2.62 \times 10^8$ Ω-CM |
| CLADDING PI2555 | $7.5 \times 10^{12}$ Ω-CM |
| CLADDING AL3355 | $7.5 \times 10^{12}$ Ω-CM |
| CLADDING UDEL | $1.2 \times 10^{11}$ Ω-CM |
| CLADDING UV15 | $\sim 10^9$ Ω-CM |

FIG. 20

| MATERIAL/ APPROACH | WAVELENGTH $\lambda$ (M) | THICKNESS D(M) | REFRACTIVE INDEX N | EO COEFFICIENT r (PM/V) | LENGTH L(M) | OVERLAP R | $\gamma_N$ | VOLTAGE LENGTH PRODUCT $V_{\pi}R\cdot L$ (V-MM) | $N^2 R$ FACTOR $N^2 T_0$ (PM/V) | ISSUES | COMMENTS |
|---|---|---|---|---|---|---|---|---|---|---|---|
| STRAWMAN SI SLOT | 1.30E-06 | 1.20E-07 | 1.7 | 80 | 2.00E-03 | 0.2 | 0.50 | 0.99 | 393 | HIGH LOSS | |
| #1 3-LAYER | 1.30E-06 | 6.06E-06 | 1.706 | 250 | 6.90E-03 | 1 | 0.50 | 3.46 | 1239 | | $V_{\pi}=(\lambda\cdot D)/(2\cdot L\cdot N^2\cdot (0.1\cdot T))$ (PUSH-PULL) |
| #2 3-LAYER | 1.30E-06 | 6.06E-06 | 1.706 | 200 | 8.60E-03 | 1 | 0.50 | 4.33 | 991 | | ALL 3-LAYER MODULATORS REQUIRE AD=-/>CAM |
| LWL 3-LAYER | 1.30E-06 | 6.06E-06 | 1.72 | 340 | 5.00E-03 | 1 | 0.50 | 2.48 | 1730 | | |
| LN X-CUT | 1.30E-06 | 1.00E-06 | 2.2 | 308 | 8.00E-02 | 0.5 | 0.50 | 39.64 | 328 | LENGTH | |

FIG. 23

ACTIVE REGION-LESS POLYMER MODULATOR INTEGRATED ON A COMMON PIC PLATFORM AND METHOD

CROSS-REFERENCE TO RELATED APPLICATIONS

This application is a Continuation-in-Part of U.S. patent application Ser. No. 15/692,080, filed 31 Aug. 2017, and claims the benefit thereof.

FIELD OF THE INVENTION

This invention relates to active region-less polymer modulators integrated into a monolithic photonic integrated circuit (PIC).

BACKGROUND OF THE INVENTION

Laser modulators have been in use for 20 years. Initially discrete lasers were positioned next to discrete modulators so that higher performance signaling (and speeds above 10 Gbps) could be attained. While this technique has been commercialized it is not optimized. That is it does not reach the low cost targets, or space/size requirements, and takes lots of time to align the components, place them, package them, and test them. Also, while some integration of lasers and modulators has occurred, optical alignment of the components can be a costly and tedious task.

It would be highly advantageous, therefore, to remedy the foregoing and other deficiencies inherent in the prior art.

Accordingly, it is an object of the present invention to provide a new and improved polymer modulator integrated on a common PIC platform.

It is another object of the present invention to provide a new and improved polymer modulator integrated on a common PIC platform with novel new design and process.

It is another object of the present invention to provide a new and improved laser and polymer modulator integrated on a common platform with more efficient coupling between source laser and optical modulator, efficient 3-layer polymer modulators, higher performance (multi GHz), and very low voltage to allow direct drive without the use of a driver circuit.

SUMMARY OF THE INVENTION

Briefly to achieve the desired objects and advantages of the instant invention in accordance with a preferred embodiment a monolithic photonic integrated circuit is provided including a platform, a monolithic laser formed in/on the platform, and a polymer modulator monolithically built onto the platform and optically coupled to the monolithic laser. The polymer modulator includes a first cladding layer, a passive core region with a surface abutting a surface of the first cladding layer, the passive core region extending to define an optical input and an optical output for the modulator, a shaped electro-optic polymer active component with a surface abutting a surface of a central portion of the passive core region, the shaped electro-optic polymer active component being polled to align dipoles and promote modulation of light, the shaped electro-optic polymer active component having a length that extends only within a modulation area defined by modulation electrodes, and a second cladding layer enclosing the shaped electro-optic polymer active component and designed to produce adiabatic transition of light waves traveling in the passive core region into the shaped electro-optic polymer active component to travel the length of the shaped electro-optic polymer active component and return to the passive core region.

To further achieve the desired objects and advantages of the present invention a specific embodiment of a monolithic photonic integrated circuit includes a substrate, a lower electrode on the substrate, a monolithic laser formed in/on the substrate, and a polymer modulator monolithically built onto the platform and optically coupled to the monolithic laser by waveguides including polymer waveguides. The polymer modulator includes a lower cladding layer on the lower electrode, a passive core region formed on the lower cladding layer and extending to define an optical input and an optical output for the modulator, a side cladding layer beside the passive core region and forming a planarized surface on the passive core region and lower cladding layer, and a shaped electro-optic polymer active component formed on a central portion of the passive core region of the planarized surface. The shaped electro-optic polymer active component is polled to align dipoles and promote modulation of light, the shaped electro-optic polymer active component has a length that extends only within a modulation area. An upper cladding layer encloses the shaped electro-optic polymer active component and is designed to produce adiabatic transition of light waves in the passive core region into the shaped electro-optic polymer active component to travel the length of the shaped electro-optic polymer active component and return to the passive core region. An upper electrode overlies the shaped electro-optic polymer active component so as to define with the lower electrode the modulation area.

To further achieve the desired objects and advantages of the present invention a specific method of fabricating a monolithic photonic integrated circuit includes the steps of providing a platform, integrating a monolithic laser in/on the platform, the monolithic laser including one of a distributed feedback laser, a Fabry-Perot laser, a distributed Bragg reflector laser, or a tunable laser, and monolithically forming a polymer modulator on the platform and optically coupling the polymer modulator to the monolithic laser by waveguides. Monolithically forming the polymer modulator includes depositing a lower electrode on the platform, depositing a first cladding layer on the lower electrode, depositing a passive core region with a surface abutting a surface of the first cladding layer, the passive core region extending to define an optical input and an optical output for the modulator, and depositing a shaped electro-optic polymer active component with a surface abutting a surface of a central portion of the passive core region. The shaped electro-optic polymer active component is polled to align dipoles and promote modulation of light and has a length that extends only within a modulation area defined by modulation electrodes. A second cladding layer is deposited to enclose the shaped electro-optic polymer active component and designed to produce adiabatic transition of light waves traveling in the passive core region into the shaped electro-optic polymer active component to travel the length of the shaped electro-optic polymer active component and return to the passive core region.

BRIEF DESCRIPTION OF THE DRAWINGS

Specific objects and advantages of the invention will become readily apparent to those skilled in the art from the following detailed description of a preferred embodiment thereof, taken in conjunction with the drawings in which:

FIG. 3A is a top view of an integrated laser/polymer modulator with semiconductor waveguide taper coupling and polymer waveguide and expansion port, according to the present invention;

FIG. 3b is a cross-sectional view of the integrated laser/polymer modulator of FIG. 3A;

FIG. 5A is a top view of an integrated laser/polymer modulator with Mach-Zehnder modulator and polymer expansion waveguide, according to the present invention;

FIG. 5B is a cross-sectional view of the integrated laser/polymer modulator illustrated in FIG. 5A;

FIGS. 7A and 7B illustrate a concept of optimized polymer modulator poling with a single resistance layer in physical and schematic views, respectively;

FIGS. 8A and 8B illustrate a concept of optimized polymer modulator poling in a three-layer stack with matched resistance layers in physical and schematic views, respectively;

FIG. 20 is a chart showing resistivity of core and cladding materials;

FIG. 23 illustrates a chart showing maximizing of the EO coefficient, and provides the specifications to achieve $V_\pi=0.5V$;

DETAILED DESCRIPTION OF THE DRAWINGS

A primary object of the present invention is to provide a new and improved laser and polymer modulator integrated on a common platform with novel new designs and processes. In the preferred embodiment, the common platform is single crystal InP, because lasers are naturally fabricated from InP and are already monolithic (part of the same material). It will be understood however, that the common platform could be silicon, GaAs, metal, plastic, or any other suitable organic or inorganic material. Also, while the laser described herein is generally InP, it will be understood that the lasers described herein could be GaAs, GaN, etc. As will be understood from the following description, the modulators are polymer based. Further, the optical connection between the laser and modulator could be input-to-output abutting engagement, free space, polymer waveguides, or semiconductor material waveguides matching the laser (i.e. InP waveguide with InP laser). The optical connecting waveguides could be dielectric based, such as silicon dioxide, silicon nitride, etc.)

One specific method or concept for the formation of a monolithic photonic integrated circuit (PIC) in accordance with the present invention, is to provide a platform/substrate, which in this specific example is InP. A laser diode (e.g. multi-layer epi and grating to form a DFB laser) is formed as part of the platform. A trench is etched in the platform/substrate and EO polymer waveguides are formed in the trench using a 3-layer structure, e.g. lower cladding layer, core, and upper cladding layer. The cladding layers are sufficiently thick so that negligible light leaks to the substrate. The waveguides are aligned with the laser emission or output channel, either directly, or via an air gap, or via a waveguide, or via a waveguide and vertical tapering of the light down to the polymer trench. Output light from the waveguide can be coupled to an output optical fiber. Alternatively, the modulator output guides can be coupled to a glass, oxide, silicon compound, or nitride guide and directed to a waveguide mux or multiplier (that can also be formed in the same material).

Figure 1A:
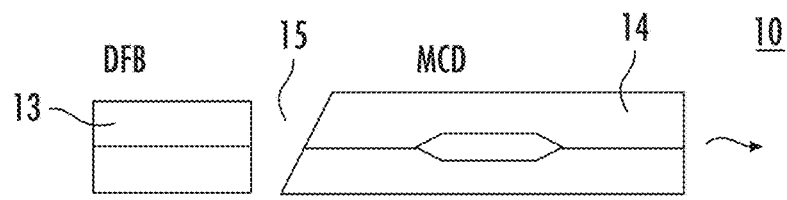
FIG. 1A is a top view of a first example of an integrated laser/polymer modulator with air gap coupling, according to the present invention.
Figure 1B:
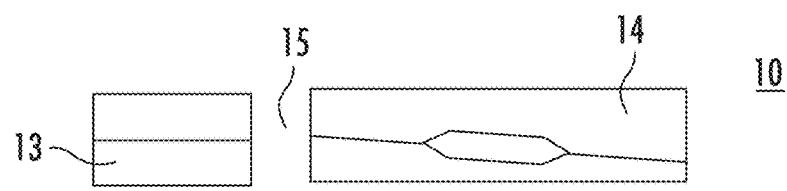
FIG. 1B is a top view of a second example of an integrated laser/polymer modulator with air gap (free space) coupling, according to the present invention.
Figure 1C:
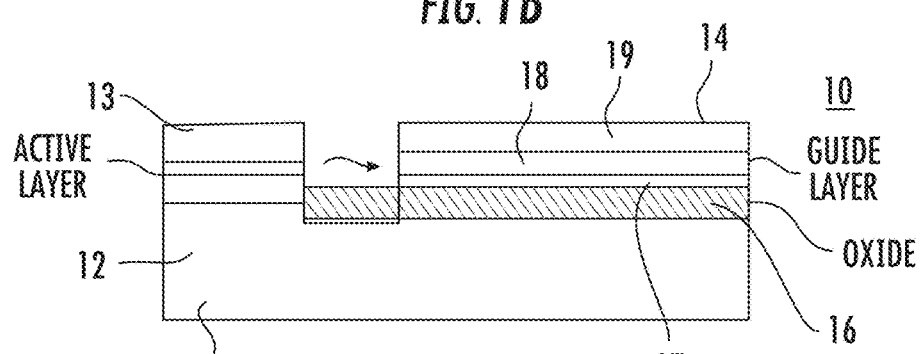
FIG. 1C is a side view of either of the integrated laser/polymer modulator with air gap (free space) coupling illustrated in FIGS. 1A and 1B.

Turning to FIG. 1, a first example of a monolithic photonic integrated circuit (PIC) 10 is illustrated. PIC 10 includes an InP platform 12 with a monolithic laser 13 formed in/on platform 12 as part of platform 12 and a polymer modulator 14 monolithically built onto platform 12. Monolithic laser 13 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. The polymer structure is isolated from the laser by a small etched gap 15 which results in free-space optical coupling between laser 13 and modulator 14. As illustrated in FIG. 1A gap 15 can be angled slightly, relative to the output of laser 13, to reduce reflections back into laser 13, or the edges can be substantially parallel as illustrated in FIG. 1B, with internal reflection compensation. Furthermore, the semiconductor laser could be designed with a spot size converted output which will provide a more efficient optical coupling to the waveguide.

In this specific example, polymer modulator 14 is illustrated as a Mach-Zehnder modulator with splitters/combiners/MMIs but as will be explained in more detail below modulator 14 can be any convenient modulator that can be fabricated in EO polymer based material. For the formation of modulator 14, a portion of platform 12 is removed (e.g. an etched trench is formed) and an oxide layer 16 is deposited on the surface of the removed portion to planarize the surface prior to polymer deposition, and also to restrict light from coupling to the substrate acting portion of platform 12. A 3-layer polymer structure, lower cladding layer 17, core 18, and upper cladding layer 19, is deposited on oxide layer 16 and gap 15 is formed.

Figure 2A:
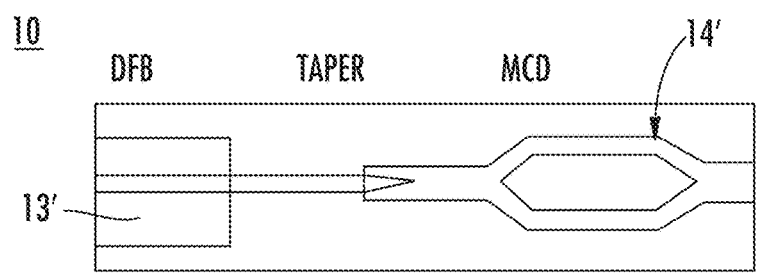
FIG. 2A is a top view of an integrated laser/polymer modulator with vertical taper coupling, according to the present invention.
Figure 2B:
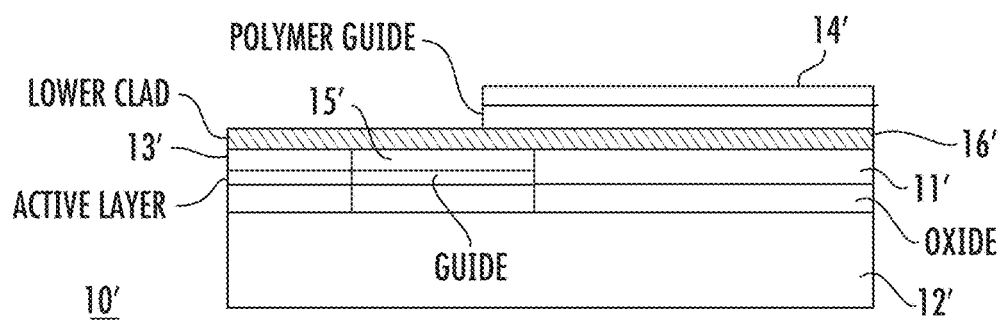
FIG. 2B is a side view of the integrated laser/polymer modulator with vertical taper coupling of FIG. 2A.

In FIGS. 2A and 2B, a second specific example of a monolithic photonic integrated circuit, PIC 10', is illustrated. PIC 10' includes components similar to those described in FIG. 1 which are designated with similar numbers and a prime (') is added to indicate the different example. In this example a section 15' of 3-layer waveguide is formed in the portion of platform 12' that is removed. Section 15' of 3-layer waveguide is formed on an oxide layer 11' and is optically aligned with the output of laser 13'. An oxide layer 16' is used to planarize the surface prior to the deposition of modulator 14'. A portion of the input of modulator 14' is deposited directly over (overlying) a portion of section 15' of 3-layer waveguide. Thus, light from laser 13' is coupled up through the vertical taper formed by the overlying waveguide portions into modulator 14'.

In the above examples, the process for fabricating modulator 14 includes forming an etched trench and depositing an oxide layer on the surface of the trench to planarize the surface prior to polymer deposition. A polymer based material is spun on/formed into the desired waveguide/modulator structure on top of or adjacent a laser formed in the platform/substrate. The bottom cladding layer of the waveguide/modulator structure can be vacuum deposited or an otherwise grown dielectric layer which has excellent thickness control. The core and top cladding layer or layers are polymers with fine thickness control. Thus, the fabrication is simple for high speed device performance and operation.

Turning now to FIGS. 3A and 3B, another example of a monolithic photonic integrated circuit, PIC 30, is illustrated. PIC 30 includes an InP platform 32 with a monolithic laser 33 formed in/on platform 32 as part of platform 32 and a polymer modulator 34 monolithically built onto platform 32. Monolithic laser 33 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. A section 35 of InP waveguide is formed on/in platform/substrate 32 in optical alignment with laser 33. A second section 36 of InP waveguide is formed in optical alignment with section 35 and is tapered, both vertically and horizontally into an output point. A trench is formed (e.g. etching, etc.) in platform/substrate 32 generally in optical alignment with laser 33 but on a lower level. The trench is formed with a first constant dimensions section and with a gradually expanding, horizontally and vertically downward, section. A dielectric lower cladding layer 37, with excellent thickness control, is deposited in the trench to planarize the surface prior to polymer deposition and to provide a lower cladding layer for the waveguides and modulator. Polymer based material 38 is deposited in the trench on dielectric layer 37 in the first section to form a core and upper cladding layer. Polymer based material 38 includes the modulator and input waveguides of PIC 30 which are optically aligned with InP waveguide section 36. That is the output point of tapered section 36 is horizontally aligned and vertically above the input of waveguide/modulator 38 so that light from laser 33 is coupled down through the vertical taper formed by the overlying waveguide portions into waveguide/modulator 38. The tapered section 39 of the trench is filled with Polymer based material which forms an expansion port to facilitate coupling light efficiently to optical fibers and the like.

Figure 4A:
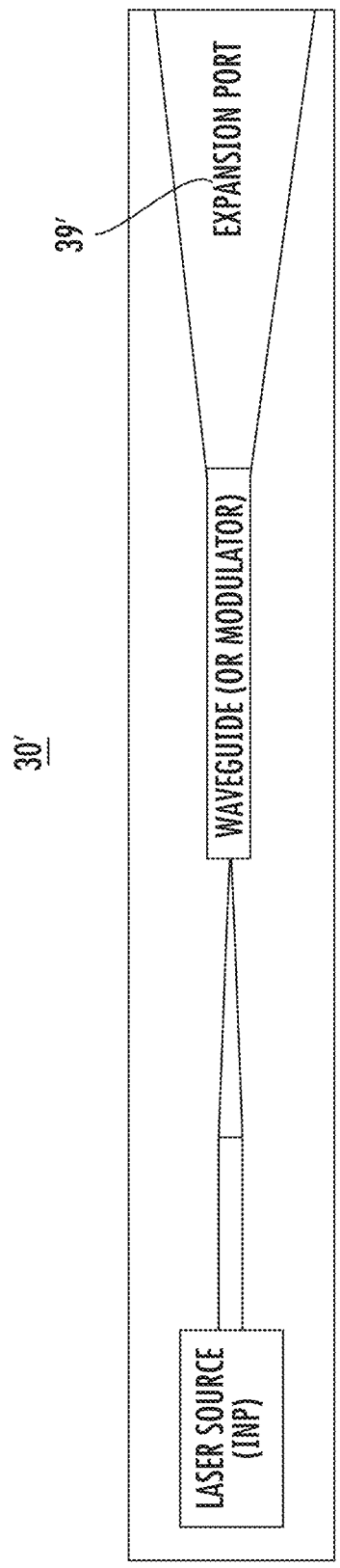
FIG. 4A is a top view of an integrated laser/polymer modulator with semiconductor waveguide taper coupling and polymer waveguide stepped expansion port, according to the present invention.
Figure 4B:
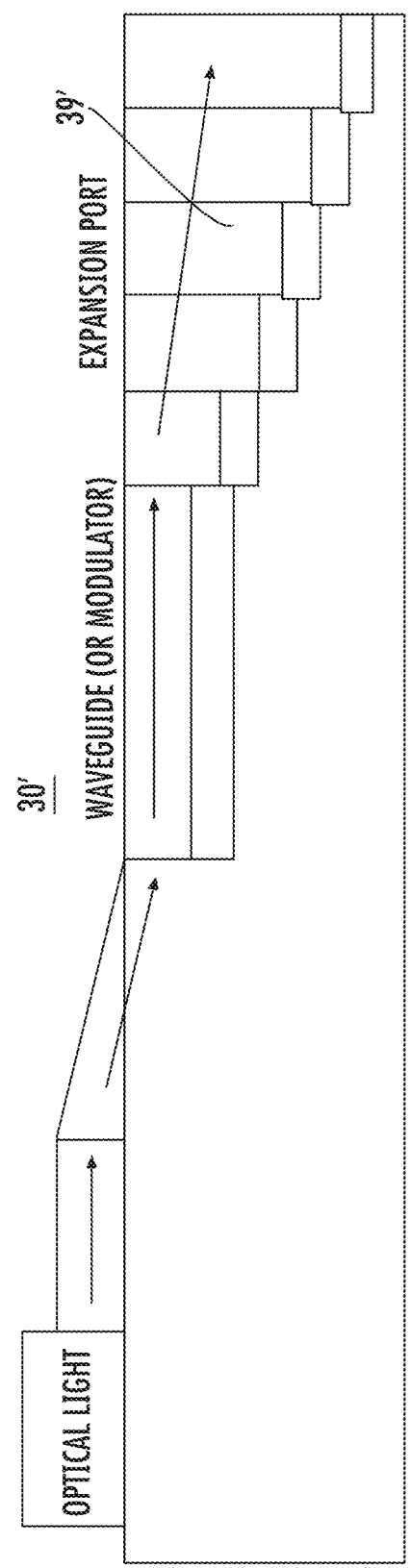
FIG. 4B is a cross-sectional view of the integrated laser/polymer modulator with semiconductor waveguide taper coupling and polymer waveguide stepped expansion port of FIG. 4A.

Referring additionally to FIGS. 4A and 4B, a monolithic photonic integrated circuit, PIC 30', is illustrated. PIC 30' includes components similar to those described in FIGS. 3A and 3B, which are designated with similar numbers and a prime (') is added to indicate the different example. In this example the only difference is that tapered section 39' is stepped downwardly to provide the vertical taper. In both examples, the core of the waveguide will reduce in volume and dimensions as the optical beam is expanded because the core of the waveguide will be less confined.

Referring now to FIGS. 5A and 5B, an example of a monolithic photonic integrated circuit, PIC 50, is illustrated. PIC 50 includes an InP platform 52 with a monolithic laser 53 formed in/on platform 52 as part of platform 52 and a polymer modulator 54 monolithically built onto platform 52. Monolithic laser 53 could be a distributed feedback (DFB) laser, a Fabry-Perot (FB) laser, a distributed Bragg reflector (DBR) laser, a tunable laser, a VCSEL (Vertical Cavity Surface Emitting Laser) or any other type of semiconductor laser. A section 55 of InP waveguide is formed on/in platform/substrate 52 in optical alignment with laser 53. A second section 56 of InP waveguide is formed in optical alignment with section 55 and is tapered, both vertically and horizontally into an output point. A trench is formed (e.g. etching, etc.) in platform/substrate 52 generally in optical alignment with laser 53 but on a lower level. All of the components of PIC 50 are similar to components of FIGS. 3A and 3B, except for modulator 54 which is a Mach-Zehnder type of modulator. The forming and filling of a trench for the fabrication of the Mach-Zehnder type of modulator 54 is described in detail in conjunction with FIGS. 6A, 6B, 6C, and 6D.

Figure 6A:
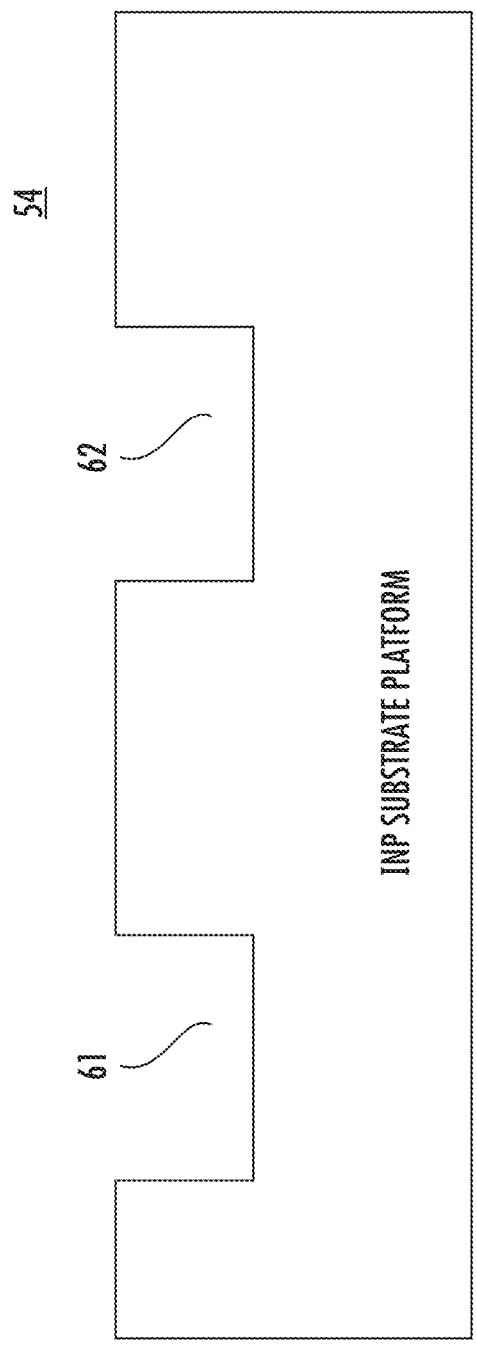
FIGS. 6A, 6b, 6C, and 6D are sequential cross-sectional views of the integrated laser/polymer modulator illustrated in FIG. 5A as seen from the line XX, showing steps in a method of forming the polymer Mach-Zehnder modulator.
Figure 6B:
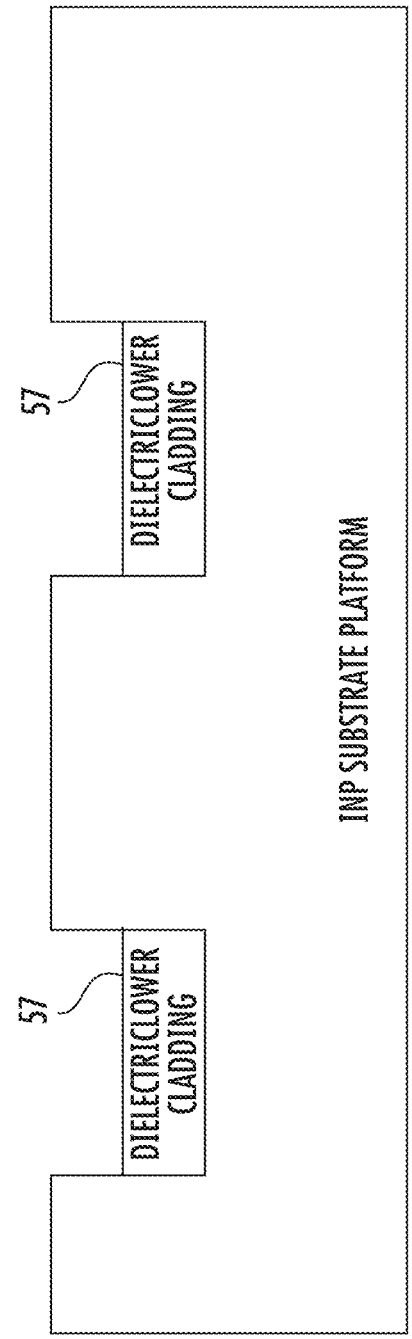

Referring additionally to FIGS. 6A, 6B, 6C, and 6D, dross-sectional views as seen from the line XX in FIG. 5A illustrate sequential steps in a process for fabricating the Mach-Zehnder type of modulator 54. As is understood in the art, in a Mach-Zehnder modulator an input waveguide is split up into two waveguide interferometer arms, represented along line XX by two spaced apart trenches 61 and 62 in FIG. 6A. Dielectric layer 57 is vacuum deposited or otherwise grown in trenches 61 and 62, as illustrated in FIG. 6B, which can be achieved with excellent thickness control. Typical dielectric materials with excellent thickness control include oxides, nitrides, oxynitrides, etc. where the deposition system is typically CVD (chemical vapor deposition). Here it will be understood that lower cladding layer 57 could alternatively be formed of polymer based material. The optical refractive index of the lower cladding material will be lower than that of the core material. The lower cladding material can be composed of either polymer or a dielectric material. Advantages of the lower cladding material are excellent thickness control so that the alignment of the core layer is accurately placed to receive optical signals from the laser source. Usual polymer lower cladding materials may include commercially available polymers such as: UV/thermal cure types UV15, UV25 from Masterbond, OC-3021 from Dymax, CO-160 from ChemOptics, Level M10-44 from Brewer Science, AL-3355 from FOC, NOA61 from Norland; as well as Epoxies from DOW, Epoxylite; as well as Thermoplastics such as UDEL from Solvay, PI2555 from HD Microsystems, Matrimid 5218 from Huntsman, Polysulfone from Aldrich and Ultem from SABIC.

Figure 6C:
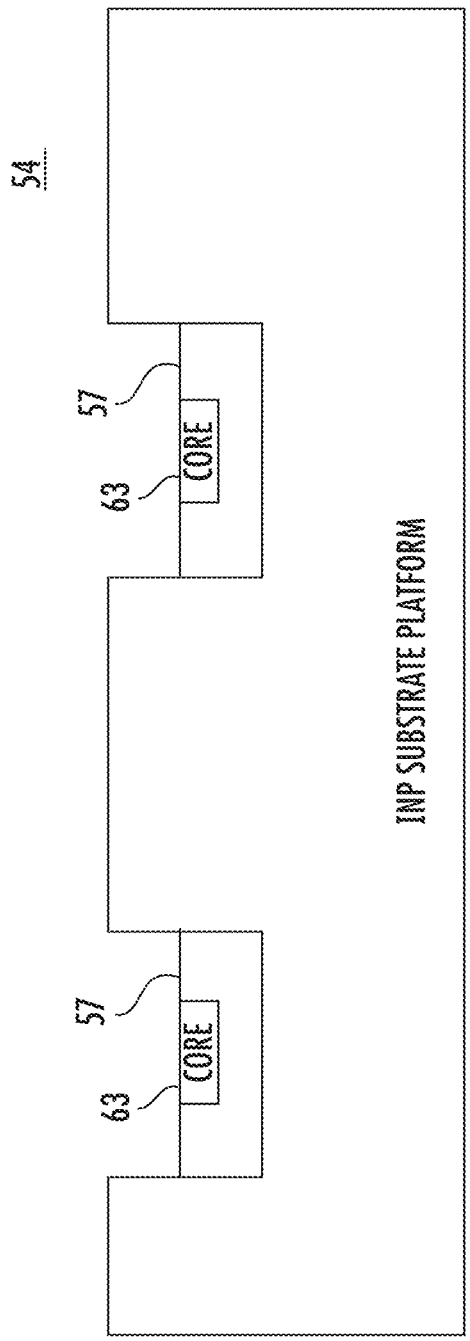
Figure 6D:
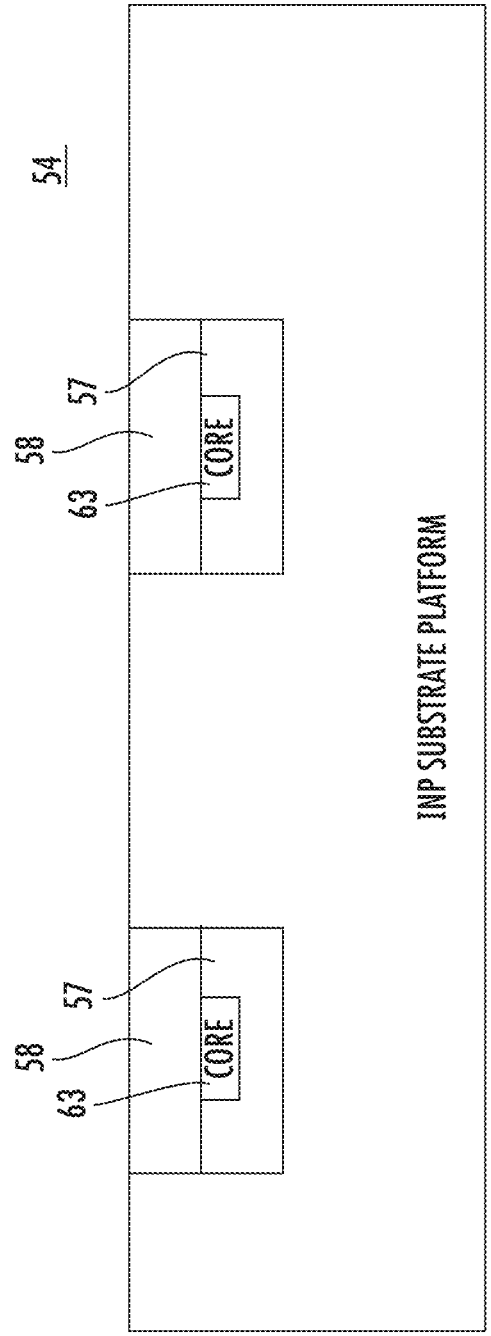
Figure 6E:
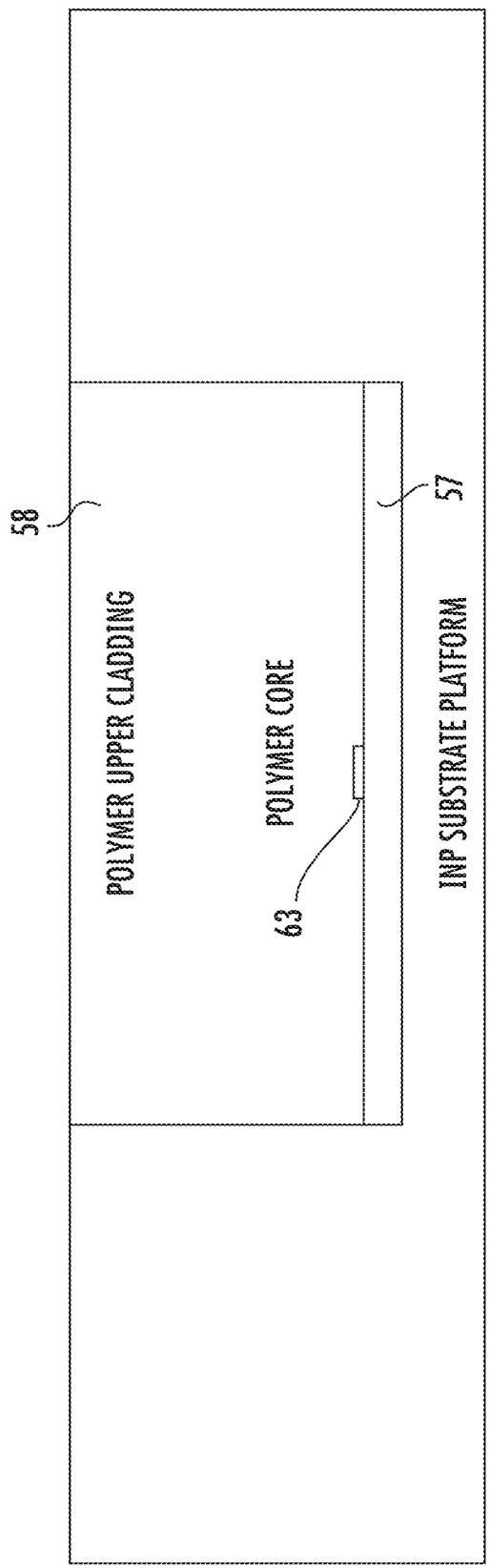
FIG. 6E is a cross-sectional view of the integrated laser/polymer modulator illustrated in FIG. 5A as seen from the line YY, showing the polymer expansion waveguide.

Lower cladding layer 57 is etched and a polymer core 63 is deposited in the etched portion, as illustrated in FIG. 6C. Trenches 61 and 62 (along with connecting portions) are back filled with an upper polymer cladding layer 58. As illustrated in FIG. 6D. It will be understood that this procedure is used to form the entire modulator section 54, as well as the entire expansion port 59. As explained above, expansion port 59 is tapered horizontally outward and vertically downward (see FIGS. 5A and 5B), and the trench is expanded similarly, as can be seen in FIG. 6E, which is a cross-section as seen from the line YY in FIG. 5A. Since the trench is expanded, lower cladding layer 57 and upper cladding layer 58 are also expanded, however, core 63 remains constant so that it is relatively smaller which improves coupling with optical fibers and smaller polymer cores.

To provide a PIC including a semiconductor platform with a laser monolithically formed in/on the platform as part thereof and an optically coupled polymer modulator monolithically built onto the platform, some initial technology and attribute must be determined. For example, one attributes to be achieved is to have a direct drive EO polymer modulator, that is, no rf drive amplification is required for the modulator. To achieve this attribute and to provide an optimized PIC, some required technical items are: a core EO polymer for the modulator with an EO coefficient, r33, ideally greater than 250 pm/v (although electro-optic coefficients of >10 pm/V will still allow the invention to operate); also, the cladding layers of the modulator need to have higher levels of conductivity (generally equal to or higher than the core), which will allow optimal poling of the polymer material; and the waveguide propagation losses need to be less than 4 dB/cm and more specifically 2.2 dB/cm for device insertion loss less than 8 dB and more specifically 6 dB. With these characteristics in mind, some explanations of the characteristics and several examples of 3, 4, and 5 layer waveguide/modulators are described.

As is understood in the art, before poling of a polymer the chromophores with a permanent dipole are randomly oriented. Poling consist of heating the polymer to a temperature near the glass transition temperature (Tg) of the material and applying an electric field to align the chromophores (or a substantial quantity of them). As is also understood, properly poling a polymer is a major determinate of some characteristics, such as EO coefficient of the material. Referring to FIGS. 7A and 7B, it can be seen that poling a single layer of polymer material (e.g. a core) is relatively straightforward, since the poling voltage is equal to the voltage applied across the core or single layer. Referring additionally to FIGS. 8A and 8B, it can be seen that once upper and lower matched cladding layers are formed with the core (e.g. a 3-layer modulator stack) the poling becomes more complex because of the voltage division between the core and the cladding layers. As described, when $V_{core}$ is approximately equal to $V_{pole}$ the EO coefficient ($r_{33}$) is maximized and the resulting drive voltage for the waveguide is minimized. Further, it can be determined from FIG. 8B and the included equation that $V_{core}$ is approximately equal to $V_{pole}$ when the conductivity of the cladding layers ($\sigma_{clad}$) is much greater than the conductivity of the core ($\sigma_{core}$).

Figure 9A:
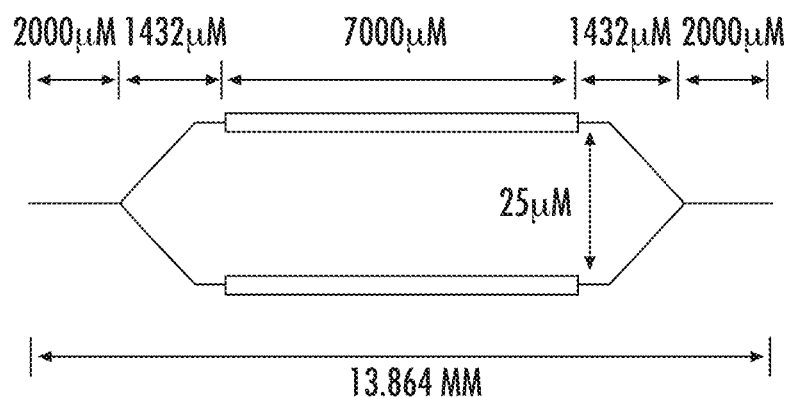
FIGS. 9A and 9B illustrate two examples of polymer Mach-Zehnder modulators with Y-splitters/combiners and with MMI splitters/combiners, respectively.
Figure 9B:
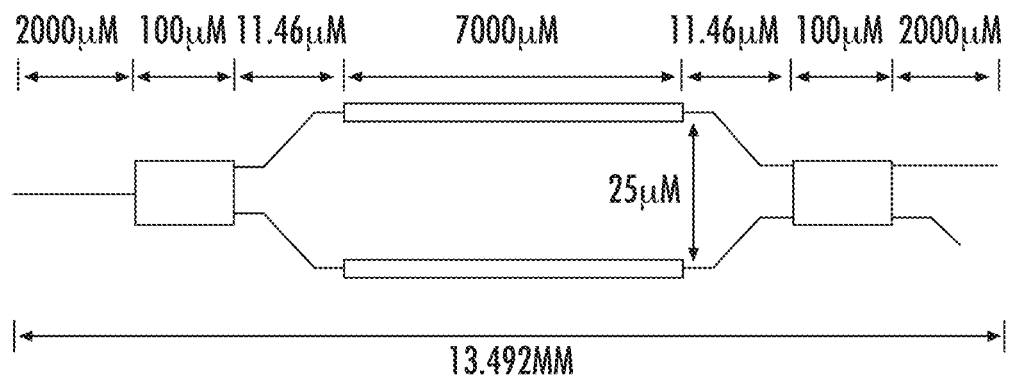

Turning to FIGS. 9A and 9B, typical Mach-Zehnder modulator layouts for the PICs described herein are illustrated. In FIG. 9A, Y-splitters/combiners are attached to a Mach-Zehnder type modulator and in FIG. 9B MMI (multimode interference) splitters/combiners are attached to the Mach-Zehnder type modulator in place of the Y-splitters/combiners. In FIG. 9A, the input waveguide is 2000 um long, the input Y-splitter is 1432 um long, the Mach-Zehnder interferometer legs are 7000 um long, the output Y-splitter is 1432 um long, and the output waveguide is 2000 um long, for a total of 13,864 mm long. In FIG. 9B, the input waveguide is 2000 um long, the input MMI splitter is 100 um long with connecting legs 1146 um long, the Mach-Zehnder interferometer legs are 7000 um long, the output mmi splitter is 100 um long with connecting legs 1146 um long, and the output waveguide is 2000 um long, for a total of 13,492 mm long. Thus, benefits of these structures are that the full length of the modulator portion of the platform is approximately 13.5 mm and as understood in the art, the length is important for packaging. For Mach-Zehnder modulator designs of this type, the higher the EO coefficient, $r_{33}$, the shorter the device length. For this type of device to be useful, the waveguide loss is preferably reduced to <2.2 dB/cm, assuming 1.5 dB coupling loss per end can be achieved and a total insertion loss of 6 dB is acceptable. With an rf design, the performance at these levels is >50 GHz.

Figure 10A:
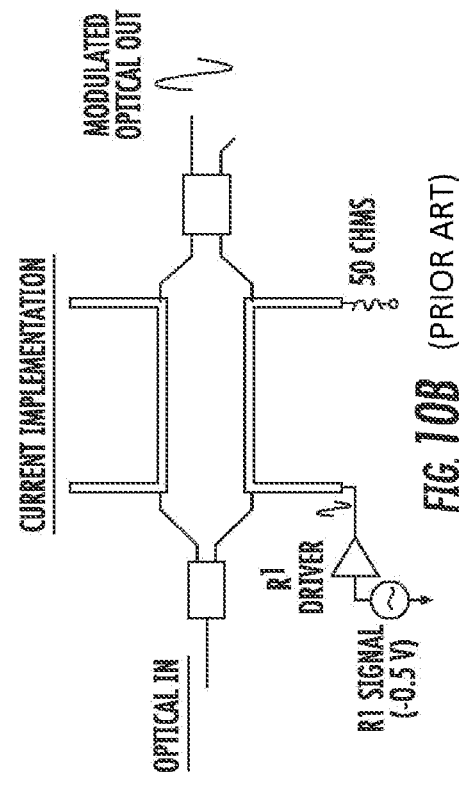
FIGS. 10A and 10B illustrate prior art polymer modulators using rf drivers in Mach-Zehnder modulators with Y-splitters/combiners and with MMI splitters/combiners, respectively.
Figure 10B:
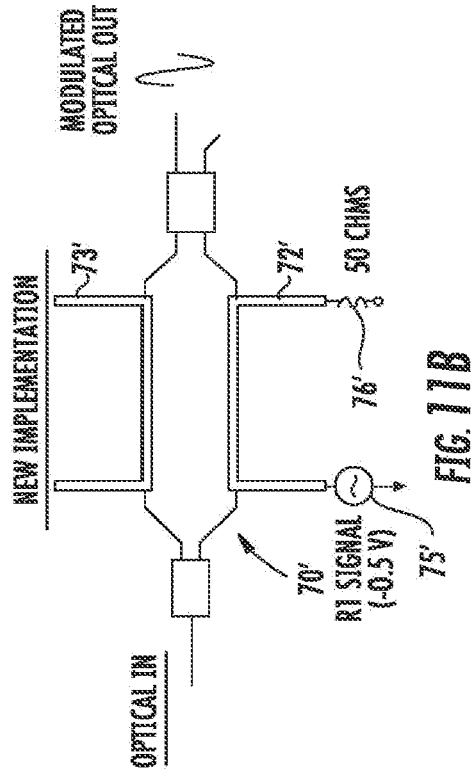
Figure 11A:
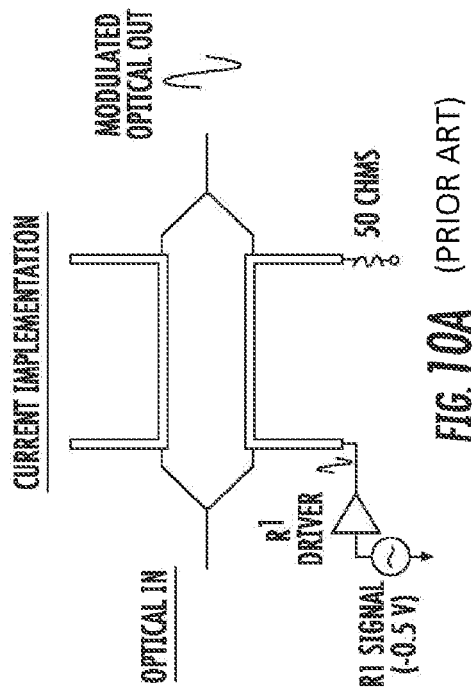
FIGS. 11A and 11B illustrate polymer modulators using direct driver signals (no rf drivers) in Mach-Zehnder modulators with Y-splitters/combiners and with MMI splitters/combiners, respectively.
Figure 11B:
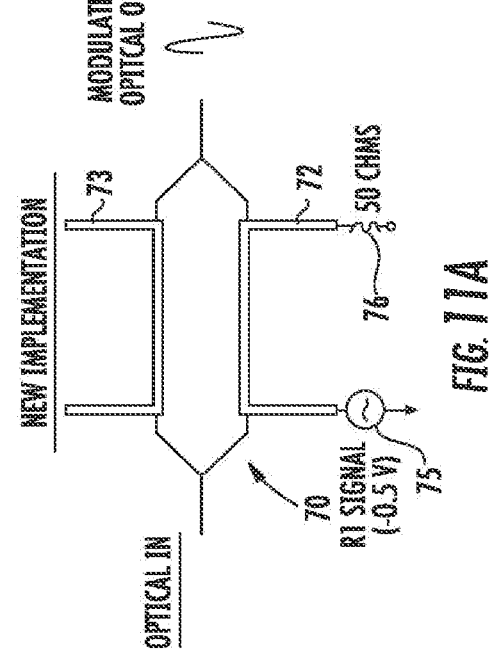

Turning now to FIGS. 10A and 10B, prior art Mach-Zehnder type modulators with Y-splitters/combiners attached and with MMI splitters/combiners attached, respectively, are illustrated. Input or modulating signals are applied to the modulators by means of U-shaped electrodes overlying each arm of the Mach-Zehnder modulator in a well-known manner. In these prior art examples rf modulating signals (set at approximately 0.5V in this example) are applied to the electrodes by way of rf drivers connected to one end of one of the U-shaped electrodes, the other end being connected through a 50 ohm current limiter to a return, such as ground. It will of course be understood that the driver adds substantial cost, size, complexity, etc. to any packaging of the modulator Referring additionally to FIGS. 11A and 11B, Mach-Zehnder type modulators, fabricated in accordance with the present invention, with Y-splitters/combiners attached, designated 70, and with MMI splitters/combiners attached, designated 70', respectively, are illustrated. Input or modulating signals are applied to each of modulators 70 and 70' by means of U-shaped electrodes, 72 and 73 for modulator 70 and 72' and 73' for modulator 70', overlying each arm of the Mach-Zehnder modulator. In accordance with the present invention, an rf modulation signal 75 of approximately 0.5V is applied directly to one end of U-shaped electrode 72 and the other end is connected through a 50 ohm current limiter 76 to a return, such as ground. Similarly, an rf modulation signal 75' of approximately 0.5V is applied directly to one end of U-shaped electrode 72' and the other end is connected through a 50 ohm current limiter 76' to a return, such as ground. Thus, two examples of direct drive polymer modulators (DDPM) are illustrated in FIGS. 11A and 11B. In this preferred embodiment, each of modulators 70 and 70' use an EO polymer with an $r_{33}$>250 pm/V. Also, modulators 70 and 70' include at least 3-layer waveguides with customized cladding layers having relatively high conductivity (see explanation above) which allows the DDPM waveguides to be optimally poled. Further, the waveguides have propagation losses less than 2.2 dB/cm and insertion losses less than 6 dB.

Figure 12A:
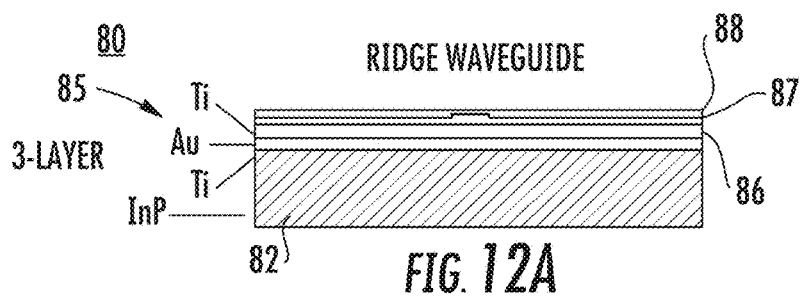
FIGS. 12A, 12B, and 12C illustrate a method of fabricating a polymer modulator using a ridge waveguide with 3-layer stack, 4-layer stack, and 5-layer stack, respectively, on an InP platform, in accordance with the present invention.

Turning now to FIG. 12A, a specific example of a 3-layer polymer modulator/waveguide 80 is illustrated. Modulator/waveguide 80 includes an InP platform/substrate 82 with a ridge waveguide 84 monolithically formed thereon. Waveguide 84 may be fabricated using any convenient method for the specific application but the method described above using the etched trench is preferred for its simplicity and accuracy. In this specific example the first material deposited on the InP surface in the trench is a metallization 85, such as Au, Ti/Au, or Cr/Au, in this example sequential layers of Ti/Au/Ti are deposited. A bottom cladding layer 86 is deposited on metallization 85, a core 87 with upwardly directed ridge is deposited on bottom cladding layer 86, and a top cladding layer 88 is deposited on core 87. Modulator/waveguide 80 is referred to as a "ridge waveguide". The modulator generally includes coplanar electrodes for poling and modulation unless a metal layer is deposited on the InP substrate below the polymer layers, hence metallization 85.

In this and the following examples, the material for cladding layers 86 and 88 is selected to have the following characteristics. The refractive index of the cladding material at 1550 nm is equal to the refractive index of the material of core 87 minus approximately 0.05. The coefficient of thermal expansion (CTE) of the cladding material is as close to the CTE of the material of core 87 as possible. The Tg of the cladding material is near the Tg of the core material (generally 150° C. to >200° C.). The resistivity of the cladding material, at room temperature, is greater than approximately $10^8$ Ohm-cm. The resistivity of the cladding material, at poling temperature (~Tg), is much less than the resistivity of the core material (<~$10^8$ Ohm-cm). The optical loss of the cladding material is less than 1 dB/cm from 1300 nm to 1600 nm. The dielectric loss tangent of the cladding material is less than 0.002 at 10 GHz. The cladding material is not chemically attacked by the core material, core material solvents, or photoresist solvents. The cladding material forms an adhesive bond with Au, Ti/Au, or Cr/Au metallization and with the core material. In addition, the cladding material must be dry etchable with reasonable etch rates, the endfaces must be able to be cleaved or direct cut, and it must provide a hermetic or at least an $O_2$ block.

Figure 21:
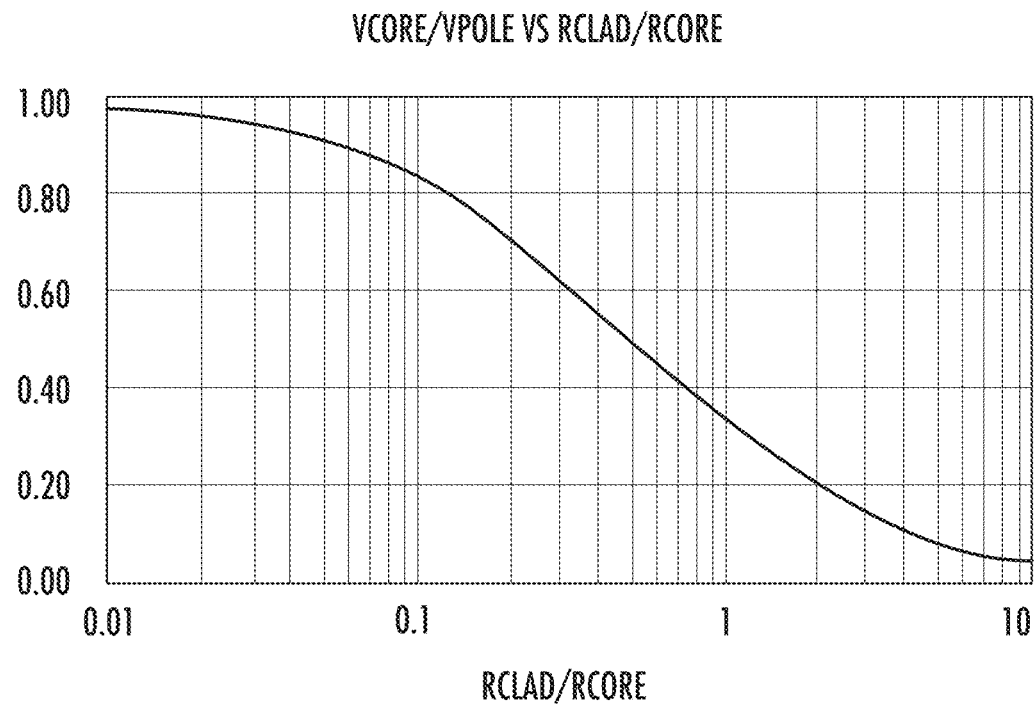
FIG. 21 is a graph illustrating the relationship Vcore/Vpole vs Rclad/Rcore.
Figure 22:
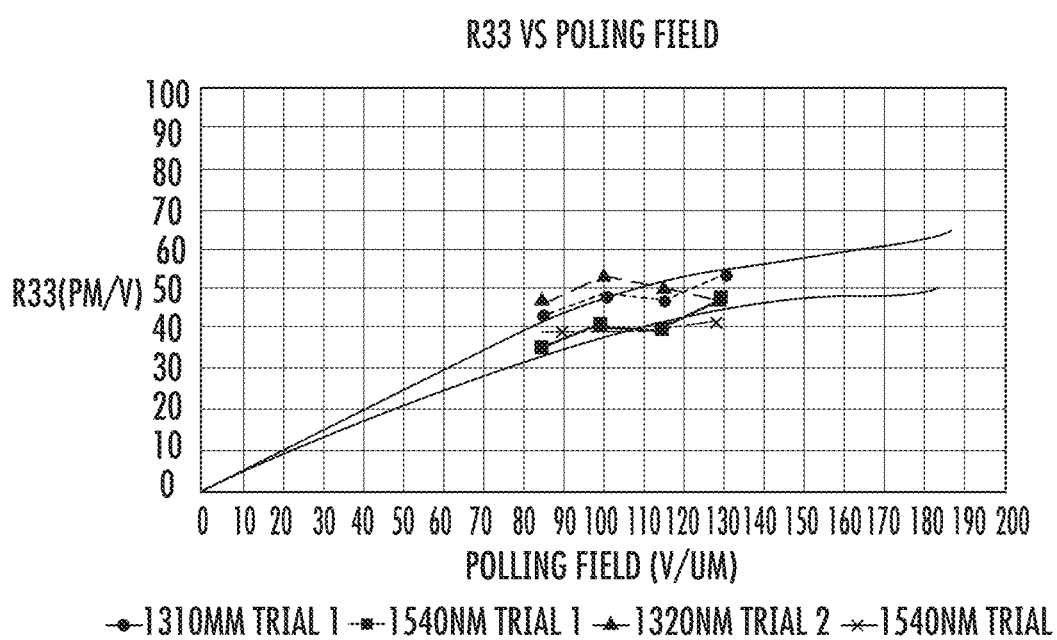
FIG. 22 is a graph illustrating the relationship of $r_{33}$ vs poling field.

A chart is illustrated in FIG. 20 that includes a list of polymer core and cladding material and their resistivity at Tg. Usual polymer lower cladding materials may include commercially available polymers such as: UV/thermal cure types; OC-3021 from Dymax, CO-160 from ChemOptics, Level M10-44 from Brewer Science, AL-3355 from FOC, NOA61 from Norland; as well as Epoxies from DOW, Epoxylite; as well as Thermoplastics such as UDEL from Solvay, PI2555 from HD Microsystems, Matrimid 5218 from Huntsman, Polysulfone from Aldrich etc. (It can be seen from this chart that core materials generally have much smaller resistivity than cladding materials. Also, in FIG. 21 a graph illustrating the relationship Vcore/Vpole vs Rclad/Rcore. From this graph, it can be determined that a smaller Vcore results in a smaller $r_{33}$ and referring additionally to the graph in FIG. 22, it can be seen that a smaller $r_{33}$ results in larger required modulator drive voltage. There are commercially available EO polymers that exhibit very large $r_{33}$ values, but the lack of a cladding material with the correct properties makes it difficult to efficiently pole these EO polymers. Many commercially available EO polymers have a low Tg making them unsuitable for typical applications. From the above charts and graphs it can be seen that EO polymer material with a large $r_{33}$ and high Tg are required.

A table is provided in FIG. 23 showing several modulator approaches. In the table, 'length' refers to the active electrode length and the 'overlap' is the overlap factor for the applied snf optical fields. For a 3-layer microstrip configuration, the overlap is ~1. The "Strawman Si slot" provides the shortest length modulator but currently has excessive optical losses. The table of FIG. 23 provides the specifications to achieve $V_\pi$ approximately equal to 0.5V. With a high EO coefficient polymer for the core ($r_{33}$>250 pm/V), and cladding with conductivity much larger than that of the core material at its poling temperature (~Tg), the active electrode length is approximately 7 mm for a $V_\pi$ approximately 0.5V using the #1 3-layer material approach.

Figure 12B:
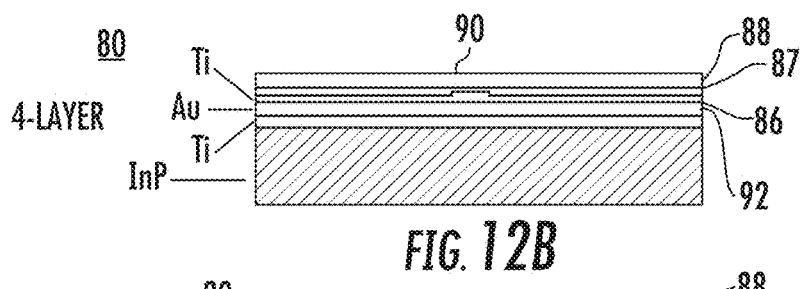
Figure 12C:
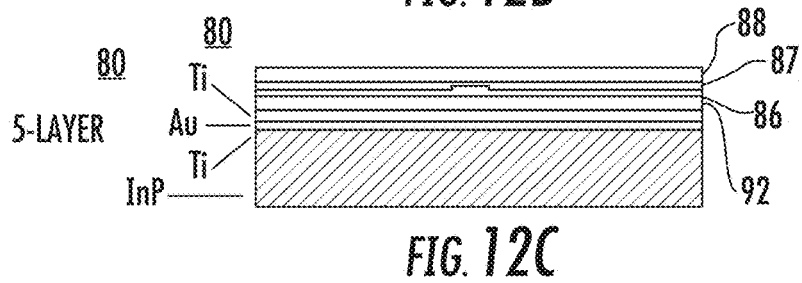

Referring additionally to FIGS. 12B and 12C, 4 and 5 layer ridge waveguides are illustrated, respectively. The 4-layer ridge waveguide illustrated in FIG. 12B is basically the same as the 3-layer ridge waveguide illustrated in FIG. 12A, except that an additional cladding layer 90 is deposited on the upper surface of cladding layer 88. The 5-layer ridge waveguide illustrated in FIG. 12C is basically the same as the 4-layer ridge waveguide illustrated in FIG. 12B, except that an additional cladding layer 92 is deposited on the metallization surface prior to the deposition of cladding layer 86, i.e. between metallization 85 and the previous bottom cladding layer 86. Additional cladding layers 92 and/or 90 may be added to enhance the characteristics of the cladding layers, allow the selection of a wider range of materials, further enhance the operation, etc.

Figure 13A:
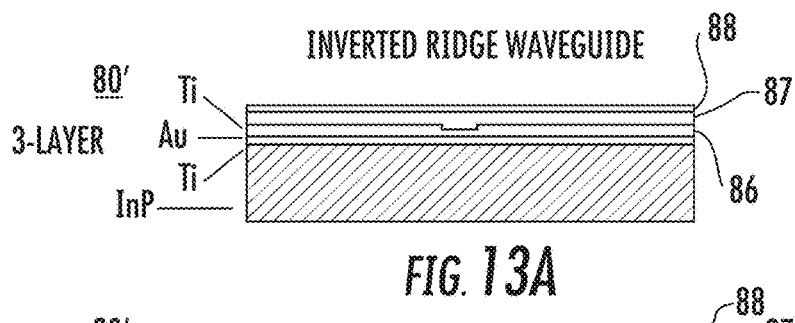
FIGS. 13A, 13B, and 13C illustrate a method of fabricating a polymer modulator using an inverted ridge waveguide with 3-layer stack, 4-layer stack, and 5-layer stack, respectively, on an InP platform, in accordance with the present invention.
Figure 13B:
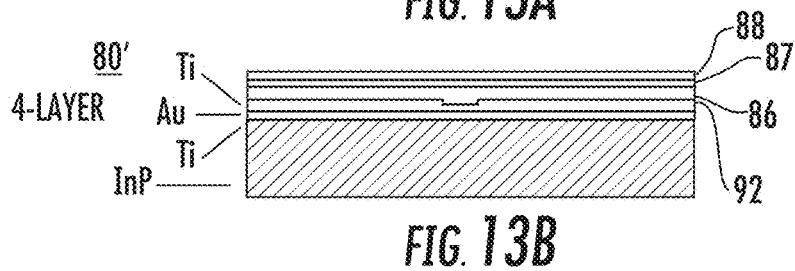
Figure 13C:
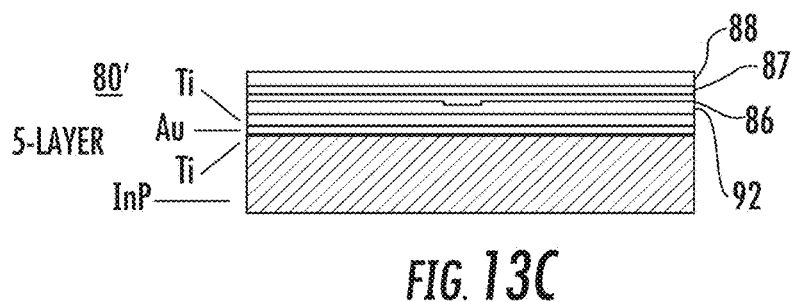

A modulator/waveguide 80' is illustrated in FIG. 13A, which is the same as modulator/waveguide 80 of FIG. 12A except that an inverted ridge and core are included. Modulator/waveguide 80' is referred to as an "inverted ridge waveguide". Referring additionally to FIGS. 13B and 13C, 4 and 5 layer inverted ridge waveguides are illustrated, respectively. The 4-layer inverted ridge waveguide illustrated in FIG. 13B is basically the same as the 3-layer inverted ridge waveguide illustrated in FIG. 13A, except that an additional cladding layer 90' is deposited on the upper surface of cladding layer 88'. The 5-layer inverted ridge waveguide illustrated in FIG. 13C is basically the same as the 4-layer inverted ridge waveguide illustrated in FIG. 13B, except that an additional cladding layer 92' is deposited on the metallization surface prior to the deposition of cladding layer 86', i.e. between metallization 85' and the previous bottom cladding layer 86'. Additional cladding layers 92' and/or 90' may be added to enhance the characteristics of the cladding layers, allow the selection of a wider range of materials, further enhance the operation, etc.

Figure 14:
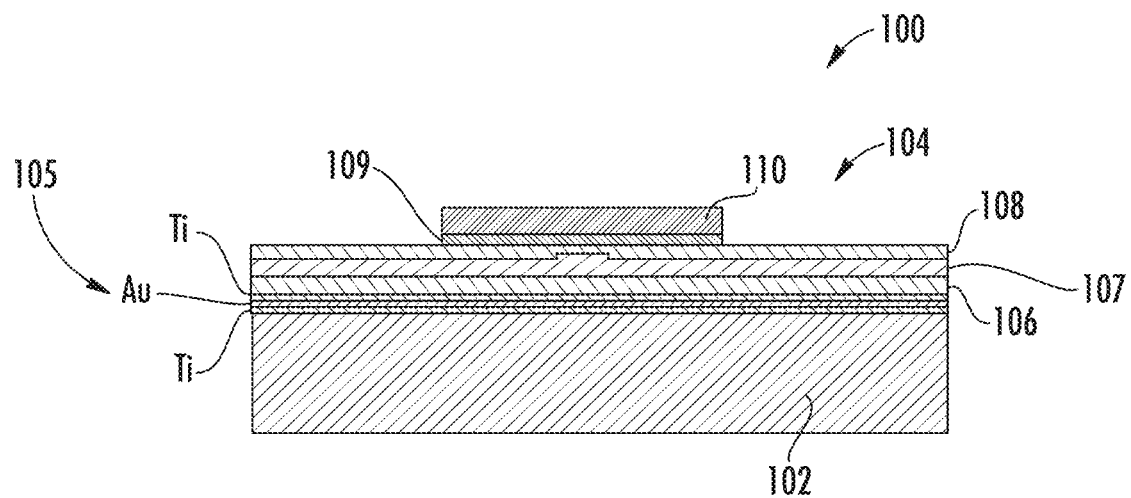
FIG. 14 illustrates a method of fabricating a polymer modulator using a ridge waveguide with 3-layer stack and bottom and top microstrip conductors on an InP platform, in accordance with the present invention.
Figure 15:
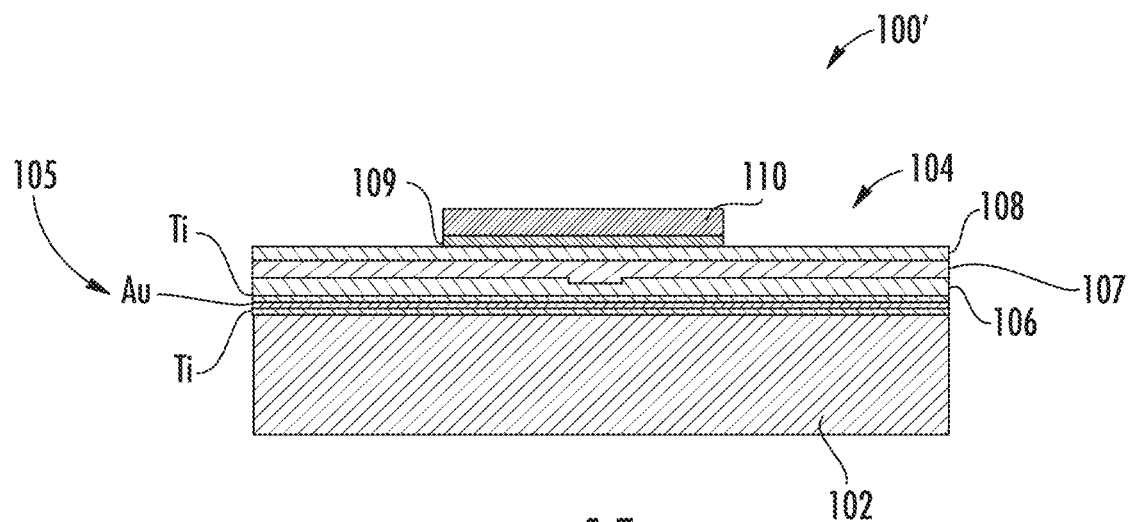
FIG. 15 illustrates a method of fabricating a polymer modulator using an inverted ridge waveguide with 3-layer stack and bottom and top microstrip conductors on an InP platform, in accordance with the present invention.

Turning now to FIG. 14, a direct drive polymer modulator (DDPM) 100 is illustrated in accordance with the present invention. DDPM 100 includes a 3-layer stack forming a ridge waveguide similar to the example illustrated in FIG. 12A with an InP platform/substrate 102 having a ridge waveguide 104 monolithically formed thereon. Ridge waveguide 104 may be fabricated using any convenient method for the specific application but the method described above using the etched trench is preferred for its simplicity and accuracy. In this specific example the first material deposited on the InP surface in the trench is a metallization 105, such as Au, Ti/Au, or Cr/Au, in this example sequential layers of Ti/Au/Ti are deposited. A bottom cladding layer 106 is deposited on metallization 105, a core 107 with upwardly directed ridge is deposited on bottom cladding layer 106, and a top cladding layer 108 is deposited on core 107. An electron blocking layer 109. Charge barriers can be composed of thinly deposited metal oxides such as titanium oxide, spin on glasses such as PDMS, organic materials such as BCB, Organo-silane compounds as well as polyvinylcarbazole. These materials provide an electrical charge barrier to reduce leakage in the device. One of these layers are deposited on the upper surface of top cladding layer 108 above the ridge formed in the core 107 and a top microstrip conductor 110 is deposited on the upper surface of electron blocking layer 109. In this specific example, metallization 105 acts as a microstrip bottom conductor and top microstrip conductor 110 completes the microstrip input. Thus, a simple and inexpensive microstrip input is conveniently integrated into the present inventive polymer modulator. Similarly, a direct drive polymer modulator (DDPM) 100' with inverted ridge waveguide and microstrip input is illustrated in FIG. 15.

Figure 16:
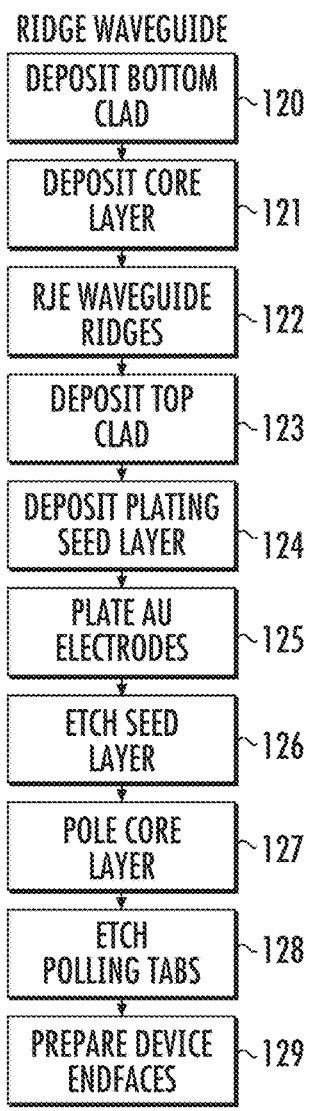
FIG. 16 illustrates steps in a method of fabricating direct drive polymer modulators using a ridge waveguide 3-layer stack.

Referring additionally to FIG. 16, a flow chart is illustrated showing a preferred process for the fabrication of ridge waveguides, such as ridge waveguide 80 illustrated in FIG. 12A. The process starts with a platform/substrate having, in this preferred embodiment a trench formed for the deposition of the ridge waveguide. The trench may also have a metallization on the bottom surface, or not. Starting with these features, in a first step 120 a bottom cladding layer is deposited. In a second step 121 a core layer is deposited. A third step 122 includes forming waveguide ridges, which in this preferred example includes reactive ion etching. A fourth step 123 consist of depositing a top cladding layer. A seed layer is plated on the upper surface of the structure, step five 124, and Au electrodes are plated on the seed layer, step six 125. The seed layer is etched to separate the Au electrodes, step seven 126, and the core is poled, step eight 137, using the Au electrodes to apply the proper field. In a step nine 128, the Au electrodes are removed by etching and in a final step 129 the waveguide is completed by preparing the endfaces as required by the specific type of device being fabricated.

Figure 17:
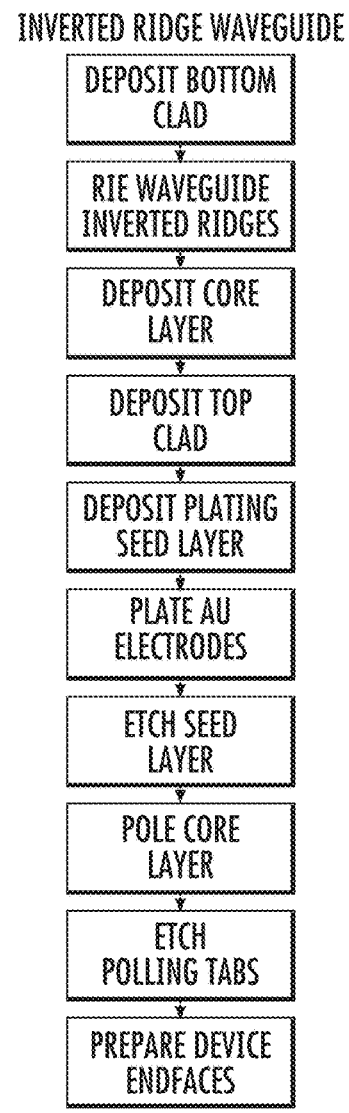
FIG. 17 illustrates steps in a method of fabricating direct drive polymer modulators using an inverted ridge waveguide 3-layer stack.

Referring additionally to FIG. 17, a flow chart is illustrated showing a preferred process for the fabrication of an inverted ridge waveguides, such as ridge waveguide 80' illustrated in FIG. 13A. All of the steps in the process of fabricating an inverted ridge waveguide are the same as those described above for a ridge waveguide, except that RIE waveguide inverted ridges are formed in the bottom cladding in a step preceding the deposition of the core layer.

Figure 18:
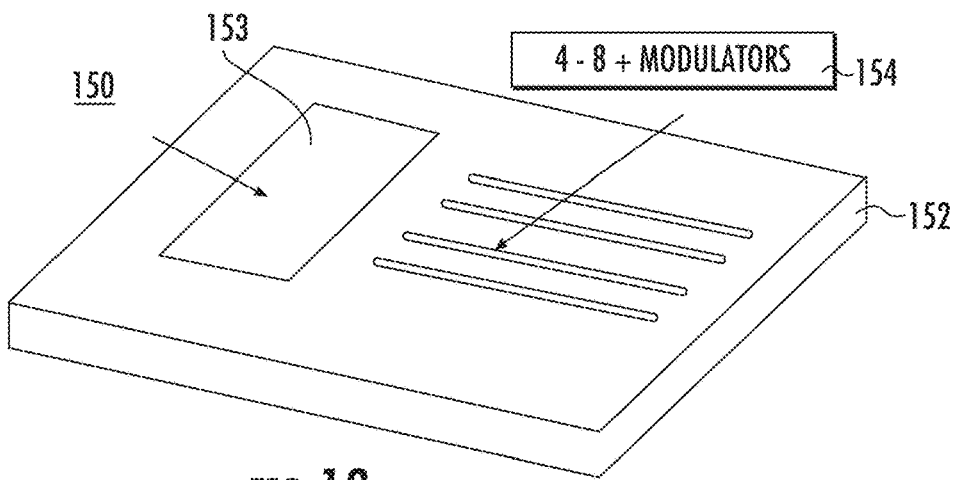
FIG. 18 is a simplified perspective view illustrating and array of lasers/polymer modulators on a semiconductor platform.

Referring now to FIG. 18, an example of multiple DDPM, designated 150, of the type described above are arrayed on a generic InP chip 152. The chip can be silicon based or an InP substrate may be deposited on the silicon and becomes the platform as used in the above descriptions. The various components may be fabricated in silicon or, as in this specific example the InP chip becomes the platform as used in the above descriptions. In the example illustrated, four monolithic lasers, designated 153, are formed in the InP platform/substrate. Four polymer modulators 154 are formed in the InP platform/substrate in optical alignment with the four lasers. While four laser/polymer modulator sets are illustrated in this example, it will be understood that to form a coarse wavelength division multiplexing (CWDM) transmitter chip, several lasers each of a different wavelength are formed on the InP chip and an array of, for example, polymer photonic (PP) modulators are fabricated to align one to each laser. The output guides could be directed to a multiplexer, for example an echelle grating or ring resonator array (not shown), and the output of the multiplexer could be coupled to an optical fiber. In this example, 4×25 G modulators result in a 100 G transmitter chip or 8×50 G could be provided for a 400 G transmitter chip.

Figure 19:
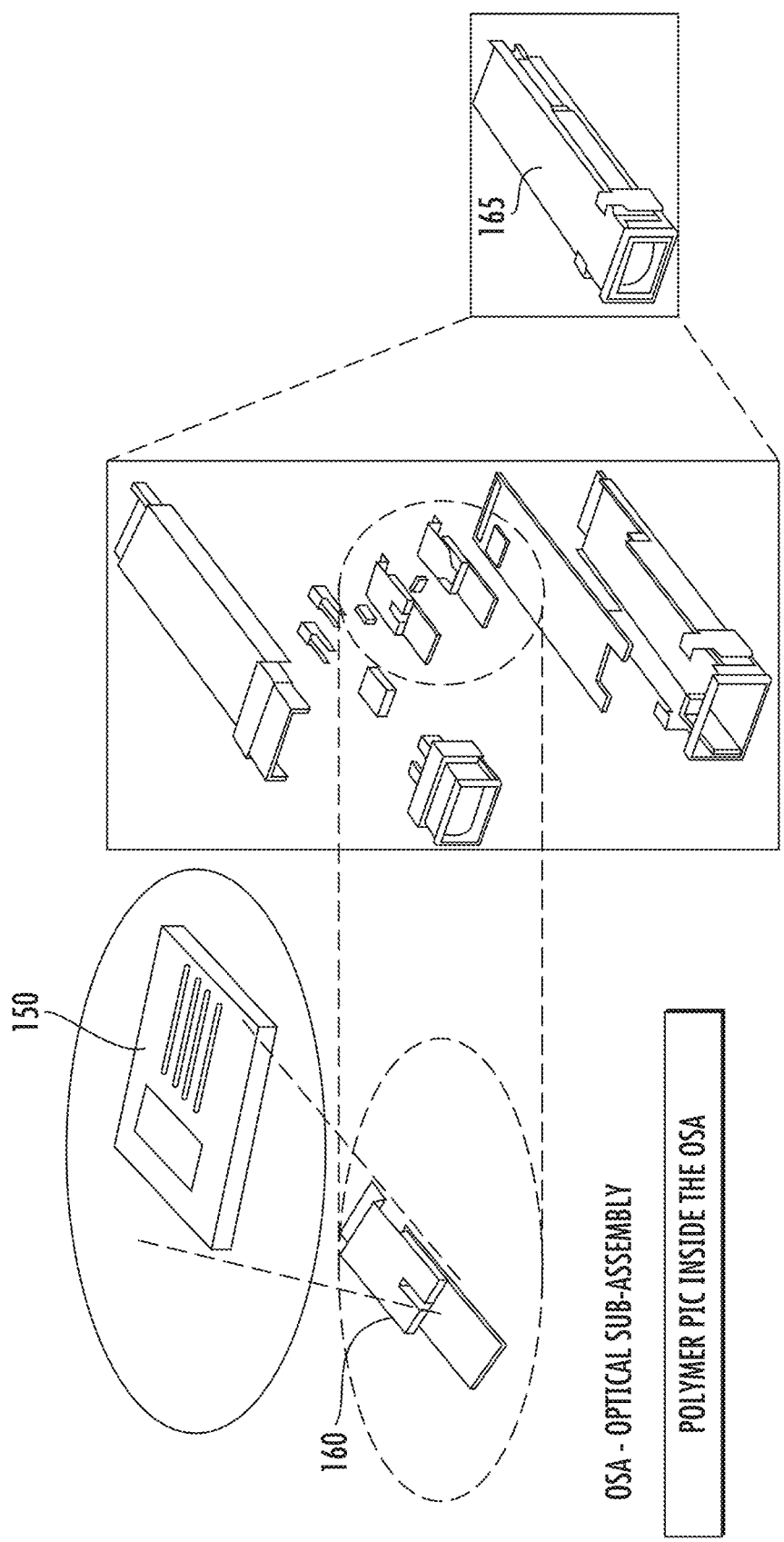
FIG. 19 is a simplified perspective view illustrating the array of lasers/polymer modulators of FIG. 18 assembled in a package module.

Referring additionally to FIG. 19, an example of a package for multiple DDPM 150 is illustrated. In this example, multiple DDPM 150 is mounted in an optical subassembly 160. Optical subassembly 160 is then mounted in a package module 165 designed around optical subassembly 160.

Figure 24:
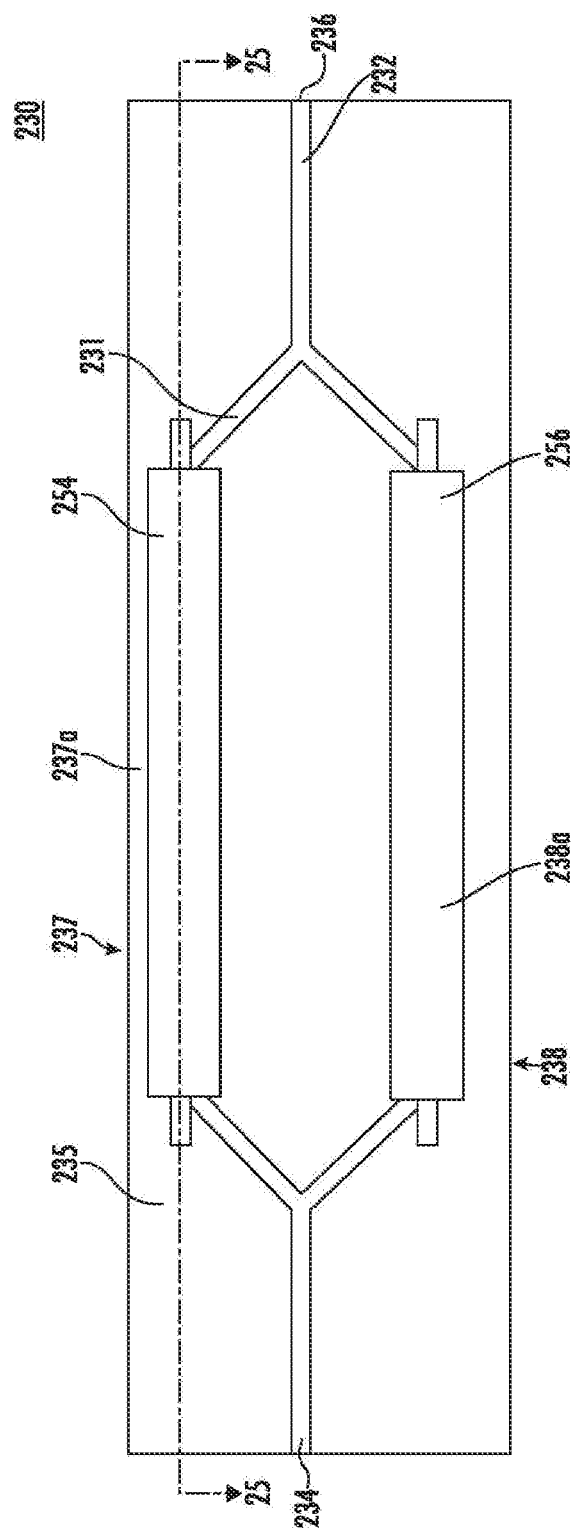
FIG. 24 is a top plan view of a Mach-Zehnder modulator with upper electrodes in accordance with the present invention.
Figure 25:
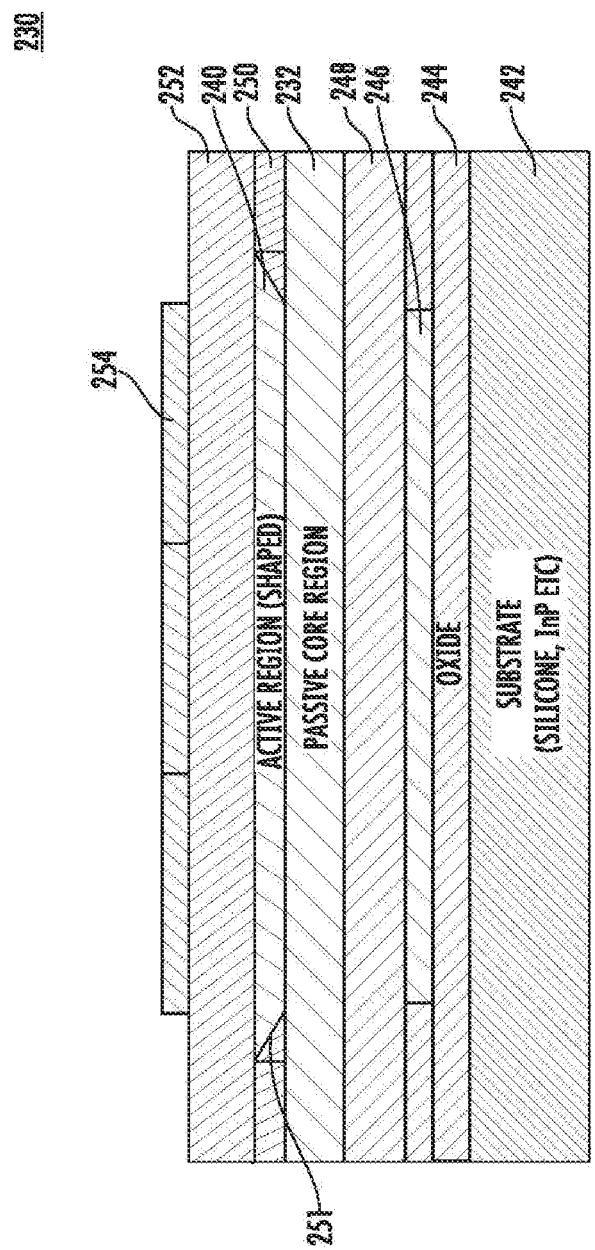
FIG. 25 is a cross sectional view of the Mach-Zehnder modulator of FIG. 24 as seen from the line 25-25.
Figure 26A:
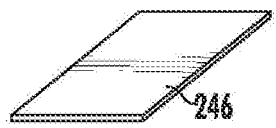
FIG. 26 (A)-(H) illustrate steps in the fabrication of the Mach-Zehnder modulator of FIG. 24.
Figure 26B:
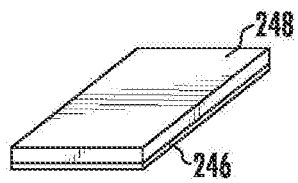
Figure 26C:
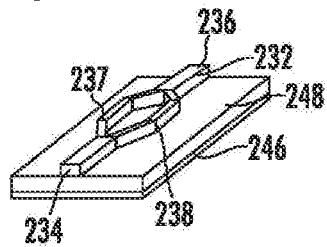
Figure 26D:
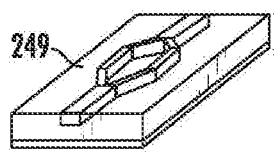
Figure 26E:
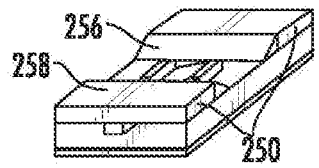
Figure 26F:
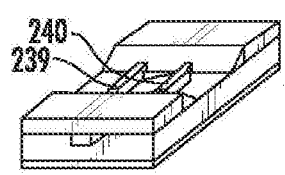
Figure 26G:
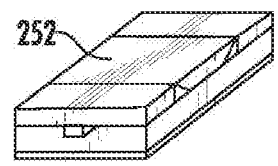
Figure 26H:
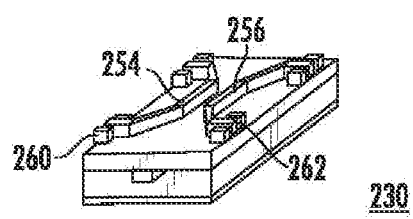

In the various above described structures, it is most desirable to include a polymer modulator that can be efficiently coupled into a photonic integrated circuit (PIC), such as illustrated in FIG. 19, for example. A polymer modulator 230 having the desired characteristics is illustrated in FIGS. 24, 25 and 26, described in detail below. Additional details as to the various characteristics, materials included, operation and methods of construction, etc. can be obtained from copending United States Patent Application entitled "Active Region-Less Modulator and Method", application Ser. No. 16/680,900, filed 12 Nov. 2019, and incorporated herein by reference. While a Mach-Zehnder modulator is used in the examples below, it will be understood that other modulators can used, including intensity modulators, for example, a Mach-Zehnder modulator, a directional-coupler modulator, a polarization modulator, etc.

Turning now to FIGS. 24 and 25, polymer modulator 230 fabricated as a Mach-Zehnder modulator is illustrated in which a passive core region 232 is formed that extends from an optical input 234, through a Y-branch 235, into legs 237 and 238, into another Y-branch 231, and to an optical output 236. Legs 237 and 238 include parallel central portions 237a and 238a which include the modulation area of modulator 230. Shaped active components 239 and 240 are formed on passive core region 232 and overlying central portions 237a and 238a of legs 237 and 238. Shaped active components 239 and 240 are preferably fabricated with a host-guest system made of a host polymer and a guest chromophore. The active component is the electro-optic guest-host that is polled to align dipoles that will promote the modulation of light with electrical energy (i.e. active component). Additional poling information can be found in a copending U.S. Patent Application entitled "Polymer Modulator and Laser Integrated on a Common Platform and Method", Ser. No. 15/692,080, filed 31 Aug. 2017 and included herein by reference. Active components 239 and 240 are confined within the periphery of the chip and do not reach the outside edges. Passive core region 232 can be any material that defines a core for a waveguide, other than an active polymer, and in this invention, is designed for more efficient optical coupling to optical fibers and free space light at optical input 234 and optical output 236. Because passive core region 232 is not active and not included in the modulation process, the dimensions are less critical and passive core region 232 can be fabricated with, for example, a larger cross-section. In this example passive core region 232 is sized larger for higher more tolerance alignment with single mode optical fibers.

Referring additionally to FIGS. 24 and 25, the various components of Mach-Zehnder modulator 230 are illustrated in more detail. A substrate 242 is provided of a semiconductor material such as silicon, InP, or the like which allows Mach-Zehnder modulator 230 to be integrated directly into other electronic circuitry and more specifically into a PIC. An insulating layer 244 of an oxide, such as silicon oxide or the like, is deposited or formed on substrate 242. Lower or ground electrode 246 of some material, such as gold, is formed on insulating layer 244 at least beneath central portions 237a and 238a of legs 239 and 240 of modulator 230. A lower cladding layer 248 is deposited over lower electrode 246 and planarizes the structure. Passive core region 232 is deposited on lower cladding layer 248 with a lower surface abutting an upper surface of lower cladding layer 248, as described above. A side cladding layer 249 (see FIG. 26 (D)) is deposited beside passive core region 232 to planarize the structure. A shaped portion 250 of an upper cladding layer 252 is deposited over passive core region 232 and side cladding layer 249 and shaped active components 239 and 240 are deposited over passive core region 232 between shaped portions 250 of upper cladding layer 252. Shaped active components 239 and 240 have lower surfaces that abut upper surfaces of passive core region 232. A remaining portion of upper cladding layer 252 is deposited to enclose shaped active components 239 and 240 and has a lower surface that abuts an upper surface of shaped active components 239 and 240. It should be understood that shaped portion 250 and shaped active components 239 and 240 can be deposited in any order commensurate with the particular shapes selected. Referring specifically to FIG. 24, upper electrodes 254 and 256 are formed on upper cladding layer 252 overlying portions of shaped active components 239 and 240 and lower electrode 246. Upper electrodes 254 and 256 are preferably formed of some easily deposited metallic material such as gold or the like. Upper cladding regions 250 and 252 are designed to allow adiabatic transition of the input optical wave up from passive region core 232 to active components 239 and 240 and back down to passive region core 232 for exiting the modulator. In this disclosure the term "adiabatic transition' is defined as meaning a transition of light from one region to another with substantially no loss or gain of energy.

In the operation of modulator 230 in FIG. 25 (for example), the main mode of single mode light enters passive core region 232 at the left and travels from left to right. The main optical mode travels until it sees a higher refractive index than the refractive index of passive core region 232. In modulator 230, as an example, the refractive index of passive core region 232 is 1.5 and the refractive index of shaped active components 239 and 240 is 1.7. In modulator 230, as the main optical mode travels to the right, it slowly sees the higher refractive index of the shaped active components 239 and 240, because of the slanted or angled portion 251 of shaped portion 250 of upper cladding layer 252, and slowly leaks into the higher refractive index material as active components 239 and 240 are brought closer to passive core region 232. The slanted portion 251 of shaped portion 250 is defined herein as an adiabatic transition and the angle determines the amount or speed with which the main optical mode leaks into active components 239 and 240. In this example the optical properties and the angle are intentionally designed to leak the main optical mode into active components 239 and 240. Preferably the angle of slanted portion 251 is about 0.4 degrees to 1 degree to the horizontal although the adiabatic transition and the optical properties and angle can be designed so that the main optical mode will leak at higher angles (e.g. up to 30 degrees) but increased light will be lost. To maintain a good leakage to higher order material, a slow adiabatic transition is preferred from the passive region to the active component and then back down to the passive region.

Turning now to FIG. 26 steps (A) through (H) in the fabrication of polymer modulator 230 as a Mach-Zehnder modulator are generally illustrated. In step (A), lower electrode 246 is deposited on insulating layer 244 on substrate 242. Lower cladding layer 248 is deposited on lower electrode 246 in step (B). In step (C), passive core region 232 is formed on lower cladding layer 248 in the shape of a Mach-Zehnder modulator with an optical input 234, an optical output 236 and legs 237 and 238. Side lower cladding layer 249 is deposited in step (D) to planarize the structure. Shaped portion(s) 250 of upper cladding layer 252 are formed on portions of passive core region 232 and side lower cladding layer 249. Shaped portion(s) 250 preferably include evanescent optical coupling planes 256 and 258. In step (F), shaped active components 239 and 240 are formed on the exposed portions of passive core region 232 (central portions of legs 237 and 238) between evanescent optical coupling planes 256 and 258 of shaped portion(s) 250. Here it should be understood that light is coupled from passive core region 232 up into active components 239 and 240 and back down into passive core region 232 by an adiabatic transition enhanced by the evanescent optical coupling. Upper cladding layer 252 is completed in step (G) to enclose active components 239 and 240 and planarize the structure. Upper electrodes 260 and 262 are formed on upper cladding layer 252 with central portions 254 and 256 overlying active components 239 and 240, respectively.

It should be noted that in active region-less polymer modulator 230 the active components do not reach the edge of the chip but are confined within the periphery of the chip (hence 'region-less'). The use of a passive core with EO polymer active components adiabatically coupled thereto results in more efficient optical coupling between the modulator chip and the outside world, and with higher reliability, since the active material is never exposed to the outside world-atmosphere and with higher reliability, since the active material is not subject to optical reflections, rough surfaces, and other effects that could affect optical light transmission. Also, waveguiding in a Mach-Zehnder modulator results in equal separation between the two branches.

An example of a PIC in which a modulator input is optically coupled to an emitter, such as a semiconductor laser, and the modulator output is optically coupled to additional components of the PIC (e.g. a mux/demux, a spot size converter, various lenses, etc.) is illustrated (specifically in FIGS. 7A and 7B) and disclosed in copending United States Patent Application entitled "Hermetic Capsule and Method", application Ser. No. 15/881,718, filed 26 Jan. 2018 and incorporated herein by reference. With this example and the above disclosure in mind, it will be understood that any of the optical coupling techniques/structures disclosed above (FIGS. 1-5), or abutting optical input 234 of polymer modulator 230 against the output of a semiconductor laser and optical output 236 against an optical input of a following component in the PIC, can be used to incorporate polymer modulator 230 into a PIC. To accomplish this incorporation, alignment of the inputs and outputs are best achieved by forming the aligned inputs and outputs with similar dimensions and refractive indexes, this is not necessary but it is more efficient. Because of the relaxed tolerances and non-active polymer material of the input and output of polymer modulator 230 dimensions can change. As an example, butt coupling between the output of a semiconductor laser and optical input 234 of polymer modulator 230 and butt coupling between the input of a following PIC component and optical output 236 of polymer modulator 230 is considered the best optical coupling. An air gap coupling (see FIG. 1A-FIG. 1C) is also acceptable as long as the distance between aligned waveguides is less than 10 μm, and preferably in a range of 1 μm to 3 μm.

Thus, a new and improved PIC incorporating an active region-less polymer modulator with more efficient optical coupling between the modulator chip and the outside world. The active region-less polymer modulator has higher reliability, since the active material is not subject to optical reflections, rough surfaces, and other effects that could affect optical light transmission. In the preferred embodiment, the semiconductor laser and polymer modulator are integrated on a common platform and optically coupled and aligned. The semiconductor laser, polymer modulator, and following PIC components are integrated on a common platform with more efficient coupling between source laser, optical modulator, and following components and more modulator reliability.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same.

The invention claimed is:

1. A monolithic photonic integrated circuit comprising:
a platform;
a monolithic laser formed in or on the platform; and
a polymer modulator monolithically built onto the platform, the polymer modulator including:
a first cladding layer;
a passive core region with a surface abutting a surface of the first cladding layer, the passive core region extending to define an optical input optically coupled to the monolithic laser and an optical output for the modulator;
a shaped electro-optic polymer active component with a surface abutting a surface of a central portion of the passive core region, the shaped electro-optic polymer active component being polled to align dipoles and promote modulation of light, the shaped electro-optic polymer active component having a length that extends only within a modulation area defined by modulation electrodes, the electro-optic polymer active component has an EO coefficient ($r_{33}$) greater than 250 pm/v, a glass transition temperature (Tg) 150° C. to 200° C. and a resistivity approximately $10^8$ Ohm-cm;
a second cladding layer enclosing the shaped electro-optic polymer active component and designed to produce adiabatic transition of light waves traveling in the passive core region into the shaped electro-optic polymer active component to travel the length of the shaped electro-optic polymer active component and return to the passive core region; and
the first and second cladding layers have levels of conductivity equal to or higher than the electro-optic polymer active component, and the first and second cladding layers have a glass transition temperature (Tg) approximately the same as the Tg of the electro-optic polymer active component, and a resistivity, at room temperature, greater than approximately $10^8$ Ohm-cm, and a resistivity much less than the resistivity of the electro-optic polymer active component at poling temperature.

2. The monolithic photonic integrated circuit as claimed in claim 1 wherein the monolithic laser consists of a distributed feedback (DFB) laser, a Fabry-Perot (FB) laser, a distributed Bragg reflector (DBR) laser, a tunable laser, or a VCSEL (Vertical Cavity Surface Emitting Laser).

3. The monolithic photonic integrated circuit as claimed in claim 1 wherein the polymer modulator consists of an intensity modulator, a Mach-Zehnder modulator, a directional-coupler modulator, or a polarization modulator.

4. The monolithic photonic integrated circuit as claimed in claim 3 wherein the polymer modulator includes a Mach-Zehnder interferometer type modulator.

5. The monolithic photonic integrated circuit as claimed in claim 1 wherein the platform is formed of InP.

6. The monolithic photonic integrated circuit as claimed in claim 1 wherein the polymer modulator is optically coupled to the monolithic laser by one of free space, polymer waveguides, or semiconductor material waveguides.

7. The monolithic photonic integrated circuit as claimed in claim 5 wherein the polymer modulator is optically coupled to the monolithic laser by waveguides including InP waveguides.

8. The monolithic photonic integrated circuit as claimed in claim 1 wherein the polymer modulator is optically coupled to the monolithic laser by waveguides consisting of 3-layer, 4-layer or 5-layer polymer waveguides.

9. The monolithic photonic integrated circuit as claimed in claim 1 wherein the polymer modulator is a Mach-Zehnder interferometer modulator optically coupled to the monolithic laser by waveguides consisting of Y-splitters and combiners or multimode interference splitters and combiners.

10. The monolithic photonic integrated circuit as claimed in claim 1 wherein the polymer modulator includes multilayer polymer waveguides having a propagation loss less than 2.2 dB/cm with device insertion loss less than 6 dB.

11. The monolithic photonic integrated circuit as claimed in claim 10 wherein the polymer modulator and multilayer polymer waveguides consist of a ridge waveguide or an inverted ridge waveguide.

12. A monolithic photonic integrated circuit comprising:
a substrate;
a lower electrode on the substrate;
a monolithic laser formed in or on the substrate;
a polymer modulator monolithically built onto the substrate and optically coupled to the monolithic laser by waveguides including polymer waveguides, the polymer modulator including:
a lower cladding layer on the lower electrode;

a passive core region formed on the lower cladding layer and extending to define an optical input and an optical output for the modulator;

a side cladding layer beside the passive core region and forming a planarized surface on the passive core region and lower cladding layer;

a shaped electro-optic polymer active component formed on a central portion of the passive core region of the planarized surface, the shaped electro-optic polymer active component being polled to align dipoles and promote modulation of light, the shaped electro-optic polymer active component having a length that extends only within a modulation area, the electro-optic polymer active component has an EO coefficient ($r_{33}$) greater than 250 pm/v, a glass transition temperature (Tg) 150° C. to 200° C. and a resistivity approximately $10^8$ Ohm-cm;

an upper cladding layer enclosing the shaped electro-optic polymer active component and designed to produce adiabatic transition of light waves in the passive core region into the shaped electro-optic polymer active component to travel the length of the shaped electro-optic polymer active component and return to the passive core region, the upper and lower cladding layers have a glass transition temperature (Tg) approximately the same as the Tg of the electro-optic polymer active component, and a resistivity, at room temperature, greater than approximately $10^8$ Ohm-cm, and a resistivity much less than the resistivity of the electro-optic polymer active component at poling temperature; and an upper electrode overlying the shaped electro-optic polymer active component so as to define with the lower electrode the modulation area.

13. The monolithic photonic integrated circuit as claimed in claim 12 wherein the monolithic laser consists of a distributed feedback (DFB) laser, a Fabry-Perot (FB) laser, a distributed Bragg reflector (DBR) laser, a tunable laser, or a VCSEL (Vertical Cavity Surface Emitting Laser).

14. The monolithic photonic integrated circuit as claimed in claim 12 wherein the polymer modulator consists of an intensity modulator, a Mach-Zehnder modulator, a directional-coupler modulator, or a polarization modulator.

15. The monolithic photonic integrated circuit as claimed in claim 12 wherein the substrate includes InP.

16. The monolithic photonic integrated circuit as claimed in claim 12 wherein the polymer modulator is optically coupled to the monolithic laser waveguides including InP.

17. The monolithic photonic integrated circuit as claimed in claim 16 wherein the waveguides have a propagation loss less than 2.2 dB/cm with device insertion loss less than 6 dB.

18. The monolithic photonic integrated circuit as claimed in claim 12 wherein the polymer modulator and waveguides consist of a ridge waveguide or an inverted ridge waveguide.

19. The monolithic photonic integrated circuit as claimed in claim 12 wherein the polymer modulator is a Mach-Zehnder interferometer modulator optically coupled to the monolithic laser by waveguides consisting of splitters, combiners, multimode interference splitters or multimode interference combiners.

20. The monolithic photonic integrated circuit as claimed in claim 12 wherein the polymer modulator is a direct drive polymer modulator with a drive voltage of approximately 0.5V.

* * * * *